United States Patent
Joshi et al.

(10) Patent No.: US 8,283,632 B2
(45) Date of Patent: Oct. 9, 2012

(54) MULTI-COLOR READ-OUT INTEGRATED CIRCUIT

(75) Inventors: Atul Joshi, Thousand Oaks, CA (US); Angelika Kononenko, Newbury Park, CA (US); David J. Chiaverini, Irvine, CA (US); Gananath Wijeratne, Thousand Oaks, CA (US); John C. Stevens, Northridge, CA (US); Selim Eminoglu, Camarillo, CA (US); William E. Tennant, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 1745 days.

(21) Appl. No.: 11/529,811

(22) Filed: Sep. 29, 2006

(65) Prior Publication Data

US 2008/0079704 A1    Apr. 3, 2008

(51) Int. Cl.
*G01J 5/00* (2006.01)
*G06F 3/038* (2006.01)
(52) U.S. Cl. ..................... 250/338.1; 345/207
(58) Field of Classification Search ............. 250/330, 250/484.4, 208.1, 338.1, 338.4, 370.01, 332; 257/21, E27.138
See application file for complete search history.

(56) References Cited

U.S. PATENT DOCUMENTS

| | | | |
|---|---|---|---|
| 5,629,522 A | 5/1997 | Martin et al. |
| 6,034,407 A | 3/2000 | Tennant et al. |
| 6,040,568 A | 3/2000 | Caulfield et al. |
| 6,469,358 B1 | 10/2002 | Martin |
| 6,495,830 B1 | 12/2002 | Martin |
| 6,498,346 B1 | 12/2002 | Martin |
| 6,531,700 B1 | 3/2003 | Brown et al. |
| 6,561,693 B1 | 5/2003 | Martin |
| 6,885,002 B1 | 4/2005 | Finch et al. |
| 6,921,897 B1 | 7/2005 | Martin |

*Primary Examiner* — David Porta
*Assistant Examiner* — Faye Boosalis
(74) *Attorney, Agent, or Firm* — Glenn H. Lenzen; Husch Blackwell LLP

(57) ABSTRACT

Embodiments of a read-out integrated circuit (ROIC) include a plurality of unit cells. Each unit cell includes a bias subsystem, a reset switch, at least one integration capacitor, and at least one read switch. A focal plane array includes a plurality of photo detectors disposed in a grid and a ROIC. A column buffer includes a first buffer subsystem, a feedback subsystem, a first and second correlated double sampling subsystem, and a second buffer subsystem. A ROIC includes at least one integration subsystem having a transistor subsection, a poly silicon layer, and a plurality of active layer sections.

48 Claims, 21 Drawing Sheets

MULTI-COLOR READ-OUT INTEGRATED CIRCUIT

FIELD OF THE INVENTION

This invention relates generally to the art of electronic infrared imaging detectors, and more specifically to a read-out integrated circuit for processing electrical signals from an infrared photodiode array.

BACKGROUND

Infrared radiation is a subset of the electromagnetic spectrum and has a wavelength longer than that of visible light. Infrared radiation is invisible to humans and may be present in situations devoid of visible light. For example, a warm object, such as a person, will emit infrared radiation in a dark environment. Additionally, infrared radiation may penetrate objects that visible light is unable to penetrate because infrared radiation has a longer wavelength than visible light. As an example, infrared radiation created by a heat source, such as a fire, may penetrate a wall that is opaque to visible light.

Infrared imaging detectors, which are well known in the art, may be used to detect infrared radiation. Such imaging detectors may be used to create an image of a scene of interest by capturing and processing infrared radiation emitted from the scene. For example, an infrared imaging detector may be used as a night vision apparatus to display an image of a scene of interest at night by capturing infrared radiation emitted from the scene. As another example, an infrared imaging detector may be used to display an image of a scene of interest in foggy conditions or to detect an existence of a fire within a building's wall. Such uses of an infrared imaging detector are possible because infrared radiation may penetrate the fog and the wall.

Infrared imaging detectors generally contain an array of a plurality of photodiodes, which capture infrared radiation emitted from a scene of interest. Each photodiode is electrically biased such that it generates an electric current in response to electromagnetic energy of a certain range of wavelengths impinging the photodiode. However, in many applications, it is desirable that the photodiode generate an electric voltage corresponding to the electric current integrated over a period of time, as opposed to an instantaneous electric current, in response to infrared radiation impinging the photodiode. Consequently, each photodiode is generally electrically connected to a respective signal processing system, often referred to as unit cell, which integrates and converts electric current generated by the photodiode into an electric voltage signal. The electric voltage signal may then be read and processed by additional subsystems. For example, a unit cell may convert electric current generated by its respective photodiode into an electrical voltage signal, which is subsequently read, buffered, and amplified by additional subsystems. A representation of the buffered and amplified electric voltage signal may then be displayed on a screen wherein the image displayed on the screen reflects electromagnetic energy emitted from a scene of interest. Each individual photodiode and its corresponding unit cell may be referred to as a pixel.

As stated above, an infrared imaging detector generally includes a plurality of photodiodes, and each photodiode is electrically coupled to a respective unit cell. A plurality of unit cells are often integrated into a single integrated circuit commonly referred to as a read-out integrated circuit ("ROIC"). A ROIC is commonly physically and electrically coupled to an array of photodiodes, often by a plurality of microscopic indium bumps. A combination of a ROIC and array of photodiodes is commonly referred to as a focal plane array ("FPA"). Accordingly, a FPA includes a plurality of pixels.

A given photodiode is generally optimized to efficiently generate an electric current in response to impinging electromagnetic radiation having a certain range of wavelengths. For example, one type of photodiode might be optimized to detect "midwave" infrared radiation, which has a wavelength ranging from 2.5 to 5.0 microns, while another type of photodiode might be optimized to detect "longwave" infrared radiation, which has a wavelength ranging from 5.0 microns to 11 or 12 microns. The range of wavelengths that a particular photodiode is optimized to detect is a function of factors including the photodiode's constituent materials and the operating conditions (e.g. bias voltage) of the photodiode.

The following are examples of various types of photodiodes and the lengths of electromagnetic radiation that they may efficiently detect. Silicon photodiodes may detect electromagnetic radiation ranging from ultraviolet to near infrared and having corresponding wavelengths ranging from 400 to 1,000 nanometers (nm). Gallium-Arsenide (GaAs) and Germanium (Ge) photodiodes may detect electromagnetic radiation having a wavelength up to 1,800 nm. Indium-Gallium-Arsenide (InGaAs) photodiodes may detect electromagnetic radiation having a wavelength ranging from 0.8 to 2.6 micrometers ($\mu$m). Indium-Antimony (InSb) and Indium-Arsinide (InAs) photodiodes may detect electromagnetic radiation having a wavelength up to approximately 5 $\mu$m. Mercury-Cadmium-Teluride (HgCdTe) photodiodes may detect electromagnetic radiation having a wavelength up to 16 $\mu$m. HgCdTe photodiodes are commonly used in infrared imaging detectors because they can detect electromagnetic radiation well into the infrared radiation portion of the electromagnetic spectrum. In addition, HgCdTe photodiodes can be optimized to capture electromagnetic radiation of a desired wavelength by tuning their bandgaps through varying the relative composition of their constituent materials.

It is often desirable that a FPA be operable to detect infrared radiation or light having at least two different wavelengths or colors, such as midwave infrared radiation or light ("MWIR") and longwave infrared radiation or light ("LWIR"). Such multicolor detection capability is desirable because different colors of infrared radiation may have unique useful properties. For example, LWIR has a greater flux density (quantity of photons per unit area per unit time) than MWIR; consequently, LWIR may be detected at a greater distance than MWIR. However, MWIR allows creation of images having a greater contrast than LWIR, therefore, MWIR allows for superior image recognition. Consequentially, an infrared imaging detector capable of detecting and processing both LWIR and MWIR will advantageously be able to simultaneously optimize long-range detection and image recognition.

As stated above, a photodiode is generally optimized to detect electromagnetic radiation having a certain range of wavelengths. Therefore, FPAs generally have a plurality of photodiodes optimized for each wavelength of electromagnetic radiation that the FPA is designed to detect. For example, if a FPA is designed to detect both LWIR and MWIR, the FPA will include a plurality of LWIR optimized photodiodes and MWIR optimized photodiodes.

Prior art multi-color infrared imaging detectors either employed two or more FPAs, wherein each FPA was optimized to detect a single color, or employed a two dimensional FPA as a one dimensional scanning array, wherein the other dimension was used to detect a plurality of colors. Recent advances have created simple, multi-color ROICs intended for use with photodiode arrays sensitive to two or more wavelengths or colors of infrared radiation. Such multi-color ROICs generally contain a plurality of essentially identical unit cells that are not optimized for their respective photodiodes. Consequently, prior art ROICs do not offer optimal signal processing capability when coupled to an array of photodiodes optimized for two or more colors of infrared radiation. Hence, there is a need for a ROIC that includes unit cells that may be optimized to detect infrared radiation having at least two colors.

SUMMARY

The multi-color ROIC and applications thereof herein disclosed advance the art and overcome at least one of the problems articulated above by providing a ROIC that may be optimized to detect infrared radiation having at least two colors.

In particular, and by way of example only, a ROIC includes a plurality of unit cells. Each unit cell includes a bias subsystem connected between a photodiode input and a reset node, and a reset switch connected between the reset node and a reset voltage rail. An isolation switch is connected between the reset node and an integration node, and an integration capacitor is connected between the integration node and a top-plate voltage rail. A read switch connected between the integration node and an output.

According to another embodiment, a ROIC includes a plurality of unit cells. Each unit cell includes a bias subsystem connected between a photodiode input and a first stage node, and a reset switch connected between the first stage node and a reset voltage rail. A first capacitor is connected between the first stage node and a top-plate voltage rail, and a first stage switch is connected between the first stage node and a second stage node. A second capacitor is connected between the second stage node and the top-plate voltage rail, and a second stage switch is connected between the second stage node and a third stage node. A third capacitor is connected between the third stage node and the top-plate voltage rail; and a read switch connected between the third stage node and an output.

According to another embodiment, a focal plane array includes a plurality of photo detectors disposed in a grid, wherein the grid has a plurality of horizontal rows of photo detectors and a plurality of vertical columns of photo detectors. Each photo detector has a first color photodiode and a second color photodiode. The focal plan array includes a ROIC having (1) an integration subsystem coupled to each photo detector, wherein each integration subsystem includes a first unit cell having a photodiode input coupled to the first color photodiode of a respective photo detector, and a second unit cell having a photodiode input coupled to the second color photodiode of the respective photo detector; (2) a first column buffer and a second column buffer for each column of photo detectors; (3) a first bus for each column of photo detectors, wherein the first bus connects an output of each first unit cell of the column to an input of the first column buffer of the column; (4) a second bus for each column of photo detectors, wherein the second bus connects an output of each second unit cell of the column to an input of the second column buffer of the column; (5) a control switching subsystem connected to an output of each column buffer; and (6) at least one output driver connected to the control switching subsystem.

According to another embodiment, a column buffer includes a first buffer subsystem having an input connected to an input node and an output connected to a first buffered node. A feedback subsystem is connected between the input node and the first buffered node. A first correlated double sampling subsystem is connected between the first buffered node and a CDS output node, and a second correlated double sampling subsystem is connected between the first buffered node the CDS output node. An input of a second buffer subsystem is connected to the CDS output node, and an output of the second buffer subsystem is connected to a column buffer bus node. The second buffer subsystem includes an enable input operable to control an operating state of the second buffer subsystem.

In yet another embodiment, a ROIC includes at least one integration subsystem. Each integration subsystem has a transistor subsection including a single nwell. The single nwell includes a p-channel depletion metal oxide field effect transistor of a biasing subsystem of a first unit cell, and a p-channel depletion metal oxide field effect transistor of a biasing subsystem of a second unit cell. The single nwell also includes an n-channel depletion metal oxide field effect transistor subsection. Each integration subsystem also includes a horizontal poly silicon layer adjacent to three sides of the transistor subsection, and a plurality of horizontal active layer sections disposed below the poly silicon layer.

DETAILED DESCRIPTION

Before proceeding with the detailed description, it is to be appreciated that the present teaching is by way of example only, not by way of limitation. The concepts herein are not limited to use or application with a specific type of ROIC. Thus, although the instrumentalities described herein are for the convenience of explanation, shown and described with respect to exemplary embodiments, it will be appreciated that the principles herein may be applied equally to other ROICs or other circuits not necessarily related to imaging.

As discussed above, a photodiode generates an electric current in response to electromagnetic radiation impinging the photodiode, and it is often desirable to convert the electric current to an electric voltage. Multi-color ROIC 100, hereinafter referred to as ROIC 100, may be used to convert electric current signals generated by a plurality of photodiodes to respective electric voltage signals, which may be used by one or more external subsystems, such as an image display subsystem.

Figure 1:
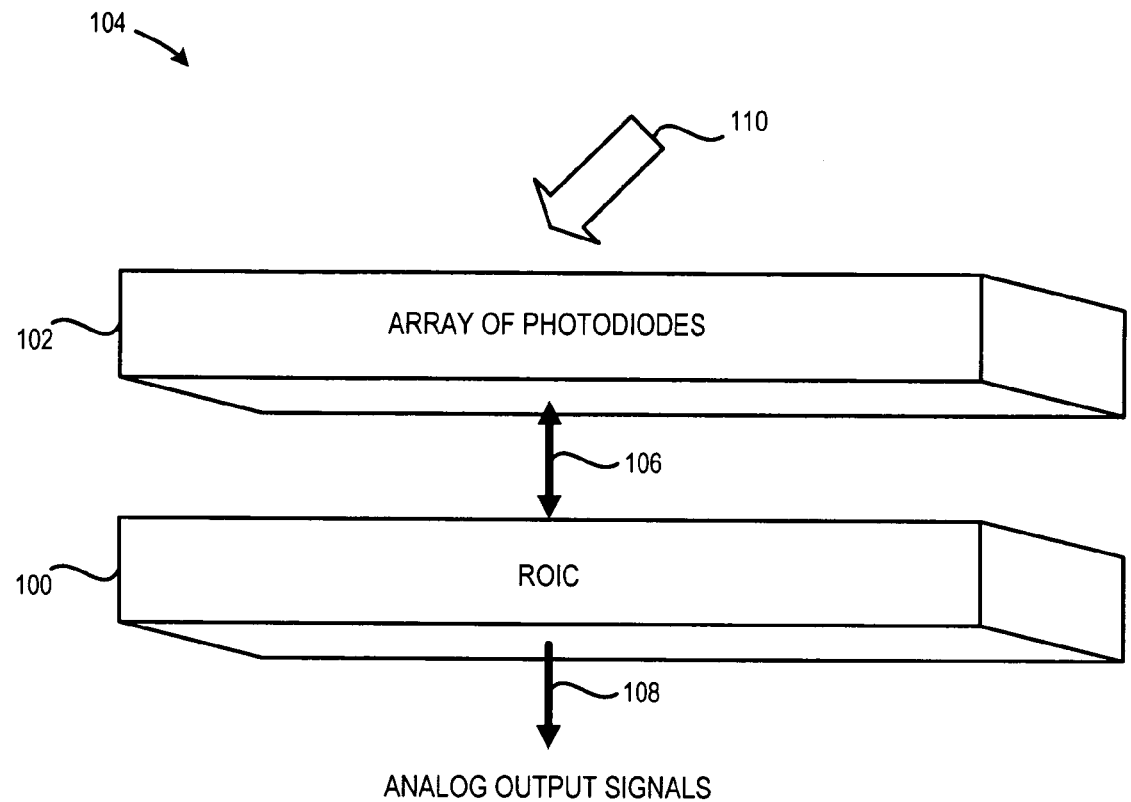
FIG. 1 schematically illustrates a FPA.

FIG. 1 schematically illustrates FPA 104, which is one application of ROIC 100. ROIC 100 is coupled to array 102 of photodiodes by connection subsystem 106. In an embodiment, connection subsystem 106 is a plurality of indium bump connections, wherein the indium bump connections electrically and mechanically couple ROIC 100 to array 102. Array 102 may include more than one type of photodiode, wherein each type of photodiode is optimized to capture a different color of infrared radiation.

Each photodiode of array 102 produces an electric current signal in response to being impinged by photons 110 of infrared radiation striking array 102. ROIC 100 converts each electric current signal to a respective electric voltage signal, each of which may be accessed by external subsystems via analog output subsystem bus 108.

Figure 2:
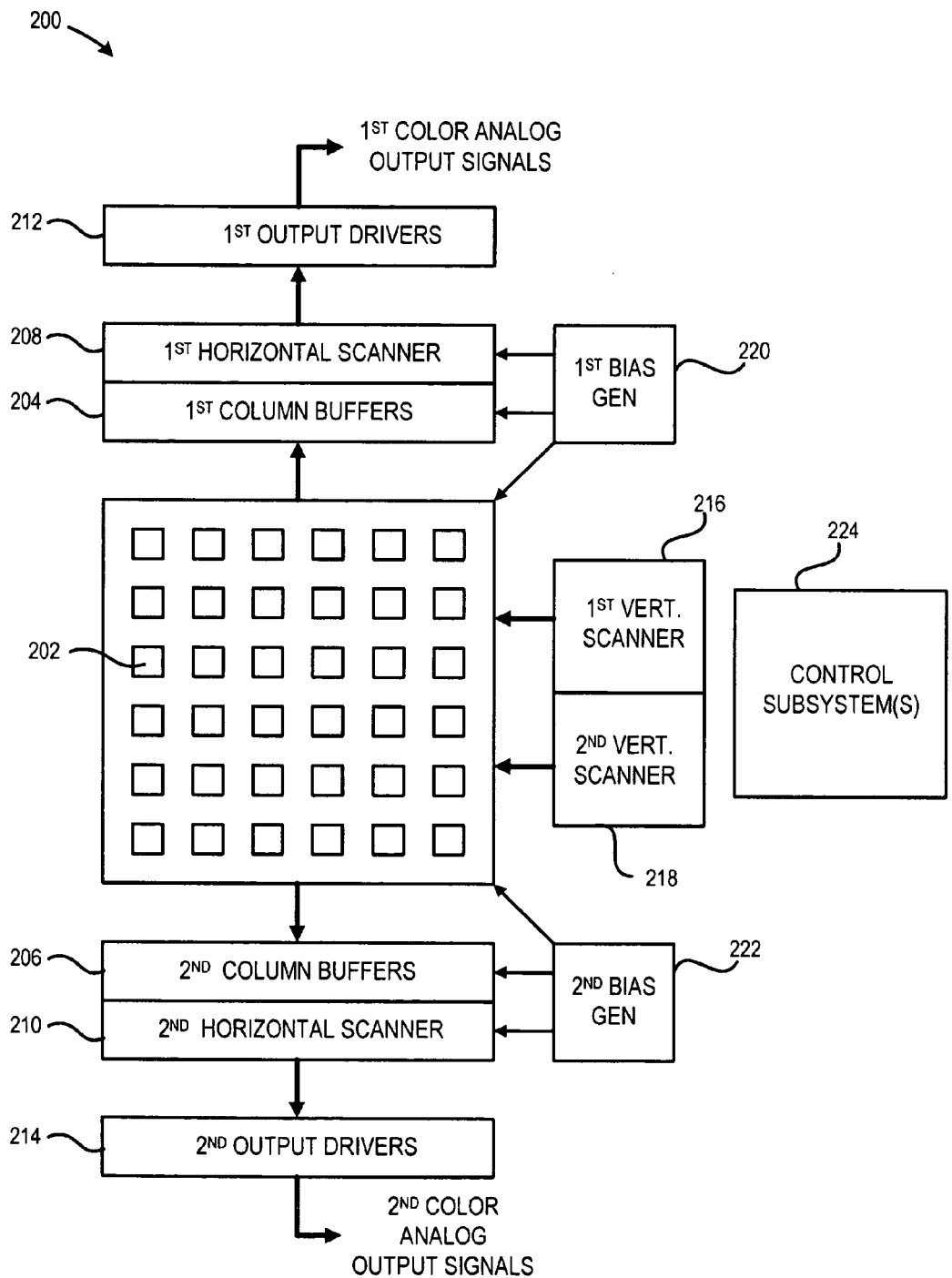
FIG. 2 schematically illustrates an embodiment of a ROIC.

FIG. 2 schematically illustrates ROIC 200, which is an embodiment of ROIC 100. ROIC 200 is operable to process electric signals from a first type of photodiode and a second type of photodiode, wherein each type of photodiode is optimized to capture infrared radiation of a different color. For example, the first type of photodiode may be optimized to capture LWIR, while the second type of photodiode may be optimized to capture MWIR. However, other embodiments of ROIC 100 may be operable to process electric signals from any number of types of diodes.

ROIC 200 includes a plurality of unit cells 202, each of which may be electrically coupled to a respective photodiode (not shown in FIG. 2). Each unit cell 202 converts an electric current signal generated by its respective photodiode to an electric voltage signal. Each unit cell 202 is intended to be connected to either a first type or a second type of photodiode. First vertical scanner 216 controls operation of unit cells 202 connected to an instance of the first type of photodiode; second vertical scanner 218 controls operation of unit cells 202 connected to an instance of the second type of photodiode. Unit cells 202 are discussed in more detail below.

First column buffers 204 and second column buffers 206 are electrically coupled to unit cells 202. In one embodiment, first column buffers 204 are solely coupled to unit cells 202 that are coupled to an instance of the first type of photodiode. Conversely, second column buffers 206 are solely coupled to unit cells 202 that are coupled to an instance of the second type of photodiode. However, in other embodiments, first column buffers 204 and/or second column buffers 206 are each coupled to all unit cells 202.

First column buffers 204 are controlled by first horizontal scanner 208, and second column buffers 206 are controlled by second horizontal scanner 210. Both sets of column buffers function to read electric voltage signals from unit cells 202. Column buffers are discussed in more detail below.

First output drivers 212 amplify electric voltage signals from first column buffers 204 to provide first color analog output signals; second output drivers 214 amplify electric voltage signals from second column buffers 206 to provide second color analog output signals. Either set of analog output signals may be read and processed by an external subsystem, such as an image display subsystem.

First bias generator 220 generates electric bias voltages required for first column buffers 204, first horizontal scanner 208, and unit cells 202 connected to an instance of the first type of photodiode. Second bias generator 222 generates electric bias voltages required for second column buffers 206, second horizontal scanner 210, and unit cells 202 connected to an instance of the second type of photodiode. One or more control subsystems 224 control operation of first horizontal scanner 208, second horizontal scanner 210, first vertical scanner 216, second vertical scanner 218, first bias generator 220, and second bias generator 222.

Figure 3:
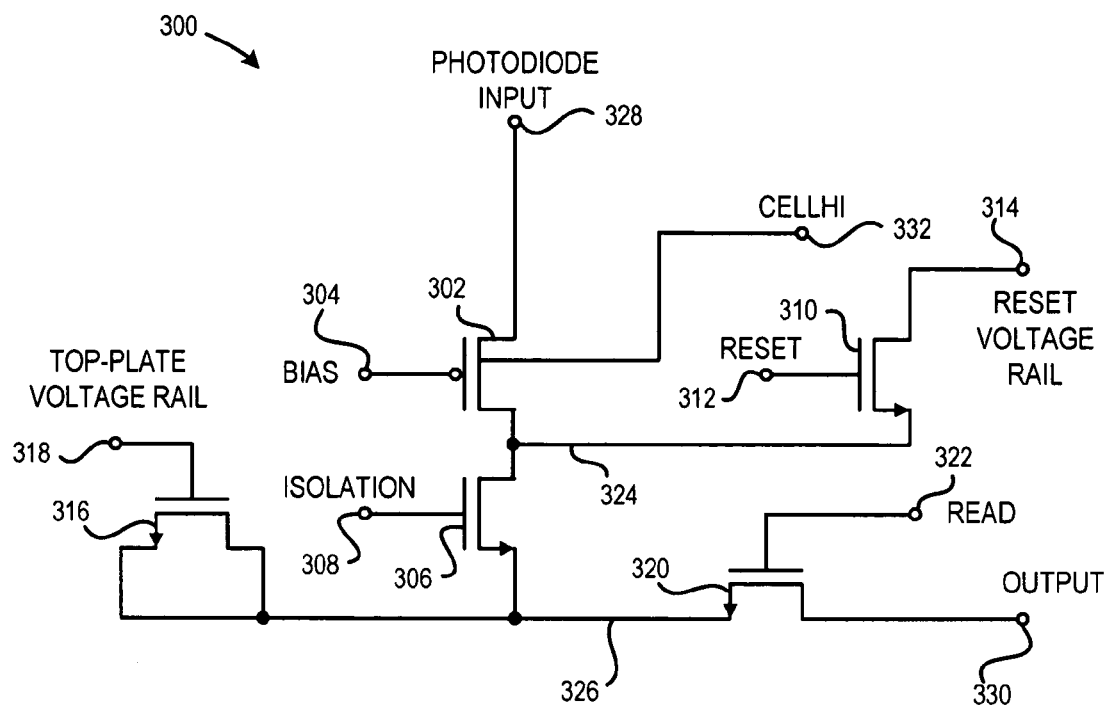
FIG. 3 schematically illustrates a single max cap unit cell.

FIG. 3 schematically illustrates max cap unit cell 300, which is an embodiment of a unit cell that may be used in ROIC 100. For example, max cap unit cell 300 may be used for some or all of unit cells 202 of FIG. 2.

Max cap unit cell 300 connects to a respective photodiode via photodiode input 328. Bias subsystem 302 is connected between photodiode input 328 and reset node 324. Bias subsystem 302 controls a magnitude of the reverse bias voltage applied on a photodiode connected to photodiode input 328 ("photodiode bias voltage"). The magnitude of the photodiode bias voltage may be adjusted by varying bias signal 304.

Bias subsystem 302 is illustrated in FIG. 3 as being implemented using a p-channel depletion mode metal oxide semiconductor field effect transistor ("P-FET") with its well connected to CELLHI voltage rail 332. However, bias subsystem 302, shown here as a direct injection ("DI") circuit, may be implemented in other acceptable manners, such as by using a capacitive transimpedance amplifier ("CTIA") or a buffered direct injection ("BDI") circuit. In an embodiment, CELLHI voltage rail 332 has a direct current voltage magnitude of about 3.3 volts.

Reset switch 310 is connected between reset node 324 and reset voltage rail 314. Reset switch 310 is controlled by reset signal 312. Reset switch 310 resets max cap unit cell 300 by clamping reset node 324 to reset voltage rail 314 when reset switch 310 is closed. In an embodiment, reset voltage rail 314 is nominally zero volts, but can be adjusted between zero and 3 volts in approximately 12 millivolt increments.

Isolation switch 306, which is controlled by isolation signal 308, connects reset node 324 to integration node 326. Integration capacitor 316 is connected between integration node 326 and top plate voltage rail 318. Integration capacitor 316 converts an electric current signal from a photodiode connected to photodiode input 328 to an electric voltage signal on integration node 326.

Integration capacitor 316 is implemented in FIG. 3 with a n-channel depletion mode metal oxide semiconductor field effect transistor ("N-FET") configured to act as a capacitor. However, integration capacitor 316 may be implemented using any other acceptable type of capacitor. In an embodiment, top-plate voltage rail 318 has a greater voltage magnitude than a supply voltage rail used as a primary power source for max cap unit cell 300 in order to increase the charge capacity of integration capacitor 316. For example, top-plate voltage rail 318 may have a magnitude of 3.6 volts while the supply voltage rail has a magnitude of 3.3 volts.

A voltage signal on integration node 326 may be read from output 330 when read switch 320 is closed. Read switch 320, which connects integration node 326 to output 330, functions to isolate integration node 326 from output 330, which may be connected to a column buffer. Read switch 320 may be required if a plurality of unit cells are connected to output 330, such as might be the case if a plurality of unit cells are to be read by a common column buffer.

Read switch 320 is controlled by read signal 322. In an embodiment, read signal 322 has a high state voltage magnitude greater than that of the supply voltage rail for max cap unit cell 300 in order to maximize a dynamic range of read switch 320. For example, read signal 322 may have a high state voltage magnitude of 3.6 volts while the supply voltage rail has a magnitude of 3.3 volts.

Reset switch 310, isolation switch 306, and read switch 320 are all implemented in FIG. 3 using N-FETs. However, reset switch 310, isolation switch 306, and read switch 320 may be implemented using any acceptable one or more components that can operate as a switch.

As stated above, it is desirable to optimize a unit cell of a pixel for operation with its respective photodiode in order to maximize the pixel's performance. Stated simply, it is desirable to optimize a unit cell for its application. Max cap unit cell 300 has several parameters than can be adjusted to optimize max cap unit cell 300 for its application.

The charge capacity of integration capacitor 316 may be optimized for the expected flux density of infrared radiation to be captured by the unit cell's respective photodiode. Generally, it is desired that integration capacitor charge capacity be proportional to the flux density of infrared radiation captured by the photodiode. For example, if max cap unit cell 300 is to be used in a MWIR application, integration capacitor 316 may have a charge capacity ranging from about 0.3 picofarads to about 0.5 picofarads. However, if max cap unit cell 300 is to be used in a LWIR application, integration capacitor 316 may have a charge capacity ranging from about 0.5 picofarads to about 1 picofarad. The charge capacity of integration capacitor 316 is greater in the LWIR application than in the MWIR application because LWIR has a greater flux density than MWIR.

The photodiode bias voltage can also be optimized for the photodiode. As was stated above, the photodiode bias voltage can be adjusted by varying bias signal 304.

Max cap unit cell 300 can also be optimized for its application by varying its operating mode as discussed below. Additionally, max cap unit cell 300 may be optimized by varying its frame rate and integration time within its operating mode.

Max cap unit cell 300 operates in a period manner—it processes a current signal from its respective photodiode in successive processing cycles. Frame rate is the inverse of the time required for max cap unit cell 300 to complete one processing cycle. For example, if max cap unit cell 300 requires 10 milliseconds to complete one processing cycle, its frame rate is 100 hertz. Accordingly, the greater the frame rate, the greater number of processing cycles max cap unit cell 300 can complete in a given time duration. However, the greater the frame rate, the less time available for max cap unit cell 300 to process an electric current signal within a given processing cycle. Frame rate is discussed in more detail below with respect to operating modes of unit cell 300.

Integration time is the amount of time during each processing cycle that integration capacitor 316 is integrating an electric current signal from a photodiode. Integration time is generally constrained by a requirement that integration capacitor 316 not saturate. Saturation occurs when integration capacitor 316 is charged beyond a point where the voltage across it can be accurately measured. The greater the magnitude of electric current flowing into integration capacitor 316, the quicker it will charge and ultimately saturate. Consequently, a maximum allowable integration time is inversely proportional to the magnitude of the electric current signal expected to be generated by the photodiode. As stated above, the magnitude of the electric current generated by a photodiode is proportional to the flux density of infrared radiation that impinges the photodiode. Accordingly, maximum allowable integration time is inversely proportional to flux density. As an example, the maximum allowable integration time will be shorter in a LWIR application than in a MWIR application.

Integration capacitor 316 integrates an electric current signal from a photodiode during each processing cycle of max cap unit cell 300. Consequently, integration time is constrained by the frame rate; the greater the frame rate, the smaller the amount of time available during each processing cycle for integration.

Max cap unit cell 300 may be operated in modes including a snap-shot mode, a ripple read mode, a standby mode, or a power down mode. The snap-shot mode may be appreciated by considering an array of pixels, wherein each pixel has photodiode and a respective unit cell (e.g. max cap unit cell 300). In the snap-shot mode, each active pixel captures infrared radiation at the same time. Consequently, the snap-shot mode is well suited for capturing fast moving images.

Figure 4:
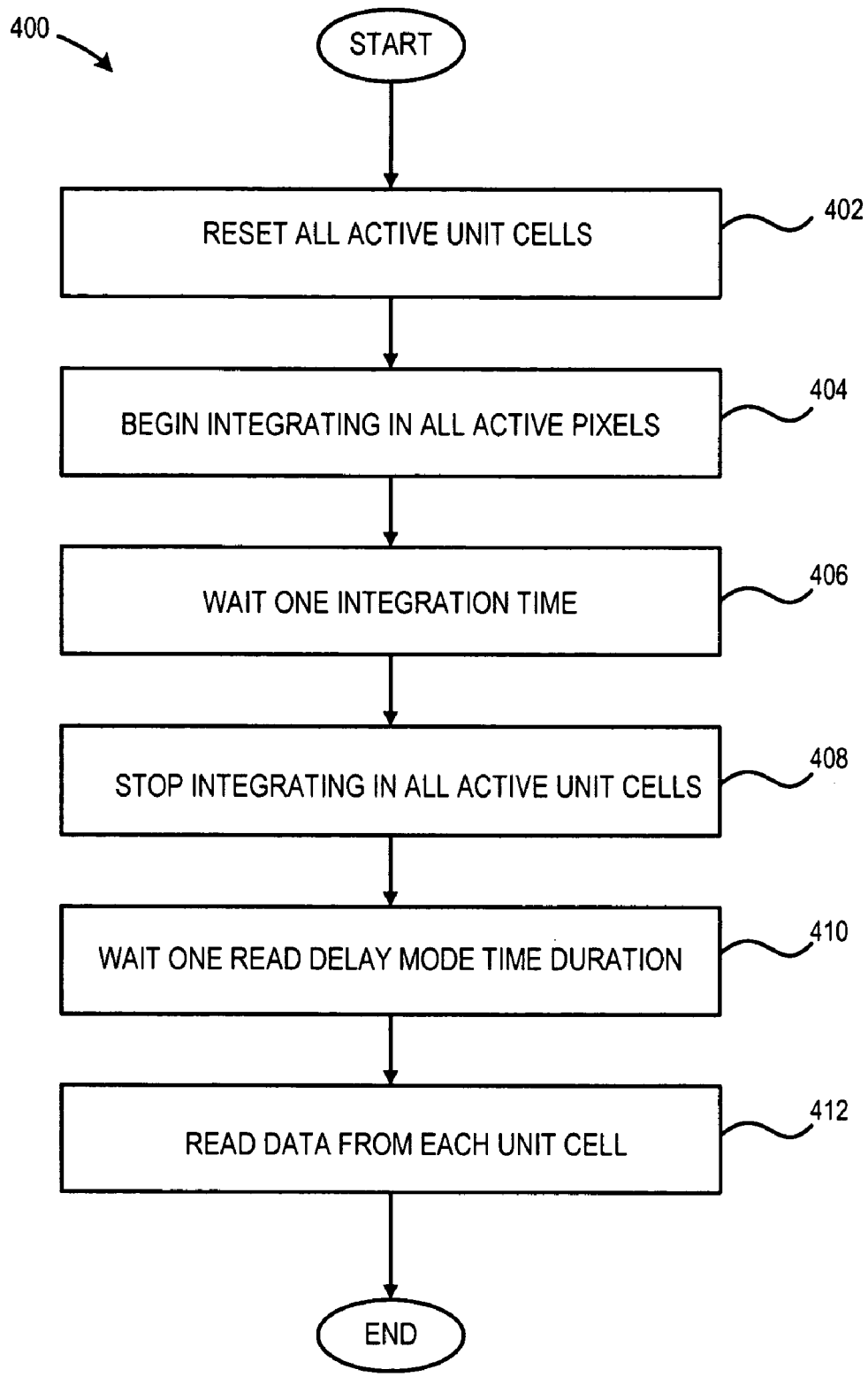
FIG. 4 is flow chart illustrating a snap-shot method of operation of a plurality of pixels.

FIG. 4 is a flow chart illustrating method 400, which is a method of operating a plurality of pixels in the snap-shot mode, wherein each pixel has a respective unit cell. Method 400 begins with step 402, wherein all active unit cells are reset. In step 404, each active unit cell begins integrating an electric current signal from its respective photodiode. An integration mode time duration is allowed to elapse in step 406, and each unit cell subsequently terminates integration in step 408. After waiting one read delay mode time duration in step 410, column buffers read the magnitude of an integrated electric signal from each unit cell in step 412.

Figure 5:
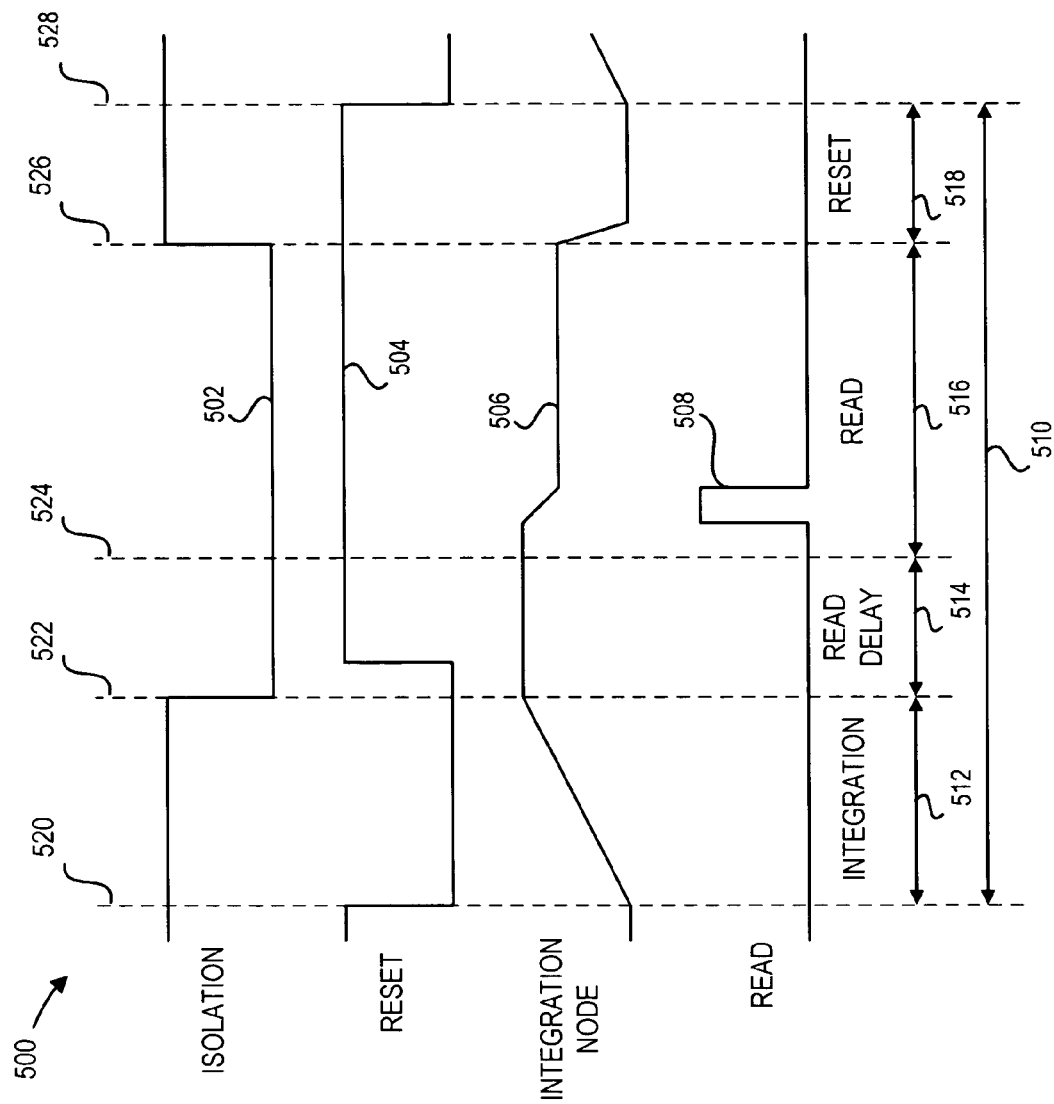
FIG. 5 is a timing diagram illustrating a snap-shot method of operation of the max cap unit cell of FIG. 3.

FIG. 5 is a timing diagram illustrating method 500, which is an embodiment of a method of operating unit cell 300 in the snap-shot mode. FIG. 5 illustrates relative magnitudes of isolation signal 308, reset signal 312, read signal 322, and the relative magnitude of the voltage on integration node 326 with respect to time. Curve 502 represents the relative magnitude of isolation signal 308; curve 504 represents the relative magnitude of reset signal 312; curve 506 represents the relative voltage magnitude of integration node 326, and curve 508 represents the relative magnitude of read signal 322. Dashed lines 520, 522, 524, 526, and 528 represent instances in time.

As stated above, max cap until cell 300 operates in a periodic manner. Accordingly, method 500 includes executing steps within processing cycle duration 510 one or more times. Max cap unit cell 300 sequentially operates in the following four modes during one processing cycle: integration mode, read delay mode, read mode, and reset mode. Method 500 has a frame rate equal to an inverse of processing cycle time duration 510.

Method 500 may be analyzed by starting with the integration mode, which begins at time 520 and has duration 512. During the integration mode, isolation switch 306 is closed while reset switch 310 and read switch 320 are open. Integration capacitor 316 is charged by electric current from the photodiode during integration mode time duration 512. Charging of integration capacitor 316 can be appreciated by noting the voltage magnitude of integration node 326 rises linearly during integration mode time duration 512.

Max cap unit cell 300 transitions from the integration mode to the read delay mode at time 522. At time 522, isolation switch 306 opens. During read delay mode duration 514, reset switch 310 closes.

The read delay mode may be used to synchronize a start of the read mode among a plurality of max cap unit cells 300. As stated above, a unit cell's integration mode time duration 512 may be varied to optimize the unit cell for its application. For example, a unit cell optimized for a LWIR application may have a shorter integration mode time duration 512 than a unit cell optimized for a MWIR application. Therefore, if the read mode were to begin immediately after termination of the integration mode in each unit cell, the read modes of each of the plurality of unit cells may begin at two or more different times. The read delay mode may be used to insure that each unit cell's read mode can begin at a same time by delaying the start of the read mode until the integration mode has terminated in each unit cell. Consequently, read delay mode time duration 514 will be inversely proportional to integration mode time duration 512.

At time 524, max cap unit cell 300 transitions from the read delay mode to the read mode. Read switch 320 is closed for a predetermined amount of time during read mode time duration 516. It may be noted that read switch 320 is closed for a small subset of read mode time duration 516; this is to allow other unit cells that are connected to output 330 an opportunity to be read during read mode time duration 516.

Max-cap unit cell 300 transitions from the read mode to the reset mode at time 526. Isolation switch 306 also closes at time 526. After reset mode time duration 518 elapses, max cap unit cell 300 transitions back to the integration mode at time 528. Reset switch 310 opens at time 528.

As stated above, max cap unit cell 300 may be operated in the ripple read mode. The ripple read mode may be appreciated by considering an array of pixels, wherein each pixel has photodiode and a respective unit cell (e.g. max cap unit cell 300). In the ripple-read mode, the array of pixels is divided into two or more subsets, wherein each pixel in a given subset is controlled in unison. However, the start and stop of unit cell integration is staggered among the subsets of pixels. Consequently, an integration state of each pixel in the array of pixels will vary at a given time; some pixels may be integrating while other pixels are being read by a column buffer. The ripple read mode has the advantage of allowing longer integration times than the snap-shot mode; consequently, a FPA may have a higher signal to noise ratio when it is operated in the ripple read mode than when it is operated in the snap-shot mode. However, fast moving images may become blurred in the ripple read mode; consequently, the snap-shot mode may be preferable to the ripple read mode in applications with fast moving images.

Figure 6:
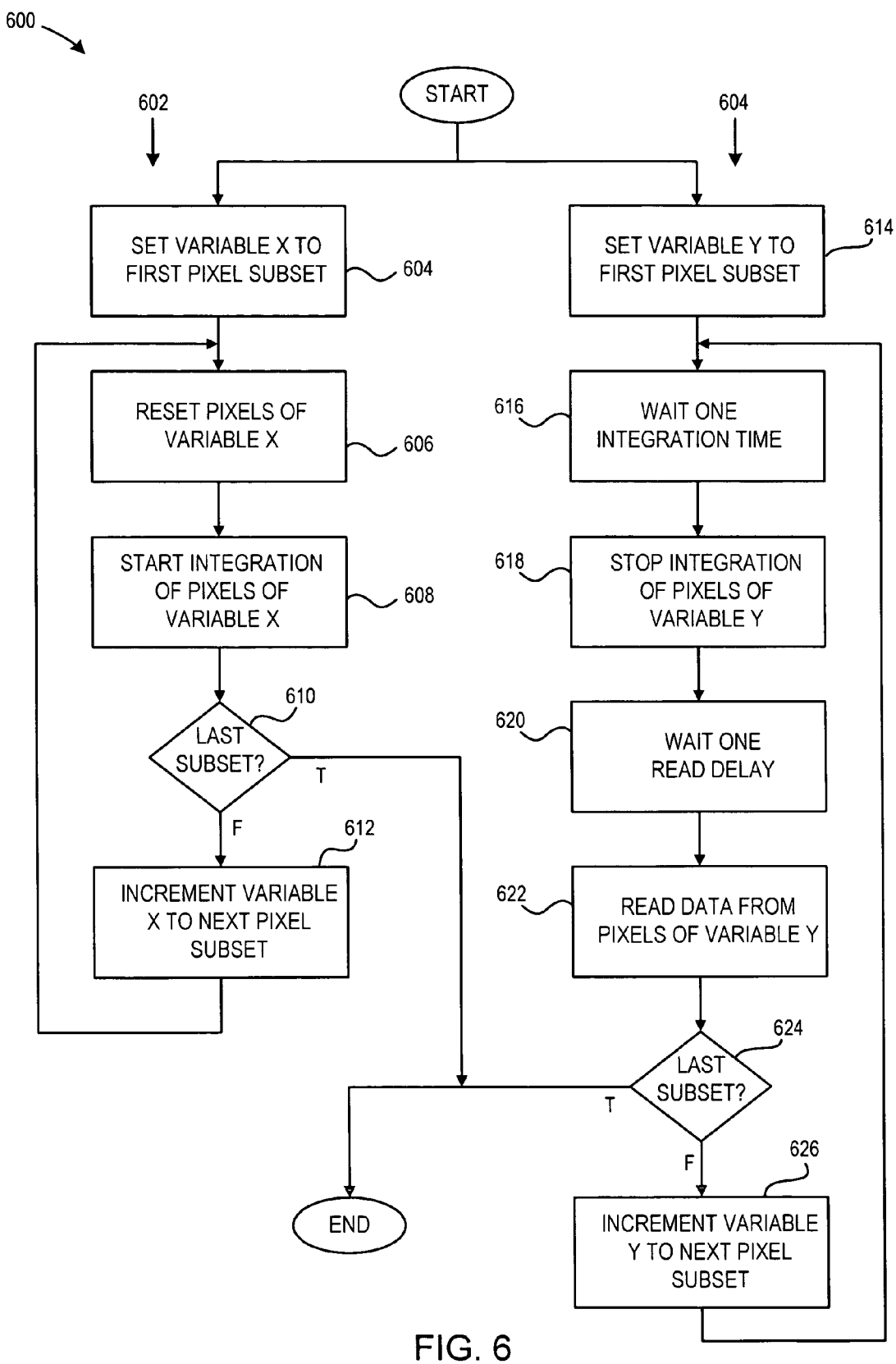
FIG. 6 is flow chart illustrating a ripple read method of operation of a plurality of pixels.

FIG. 6 is a flow chart illustrating method 600, which is a method of operating a plurality of pixels, each having a unit cell, in the ripple read mode. In method 600, the plurality of pixels are divided into two or more subsets of pixels. Method 600 essentially has two sets of steps, sets 602 and 604, which operate largely in parallel.

Set of steps 602 begins with step 604, wherein variable X, which represents a subset of pixels that is currently being controlled, is set to the first subset of pixels. In step 606, the unit cells of the subset of pixels represented by variable X are reset, and in step 608, integration is started in the pixels represented by variable X.

Decision 610 determines whether variable X represents the last subset of pixels. If the result of decision 610 is false, integration has not begun in all subsets of pixels. Consequently, operation proceeds to step 612 wherein variable X is incremented to represent the next subset of pixels, and operation returns to step 606.

If the result of decision 610 is true, integration has begun in all subsets of pixels. Accordingly, set of steps 602 terminates.

Set of steps 604 begins with step 614 wherein variable Y, which represents a subset of pixels currently being controlled, is set to the first subset of pixels. In step 616, operation waits for one integration mode time duration. Subsequently, in step 618 integration is stopped in the subset of pixels represented by variable Y.

In step 620, operation waits one read mode time duration and then proceeds to step 622 wherein data (i.e. a voltage on an integration node) is read from each pixel of the subset of pixels represented by variable Y.

Decision 624 determines whether variable Y represents the last subset of pixels. If the result of decision 624 is false, not all pixels have been read, and operation proceeds to step 626 wherein variable Y is incremented to represent the next subset of pixels. Operation then returns to step 616.

If the result of decision 624 is true, each subset of pixels has been read. Accordingly, set of steps 604 terminates.

Figure 7:
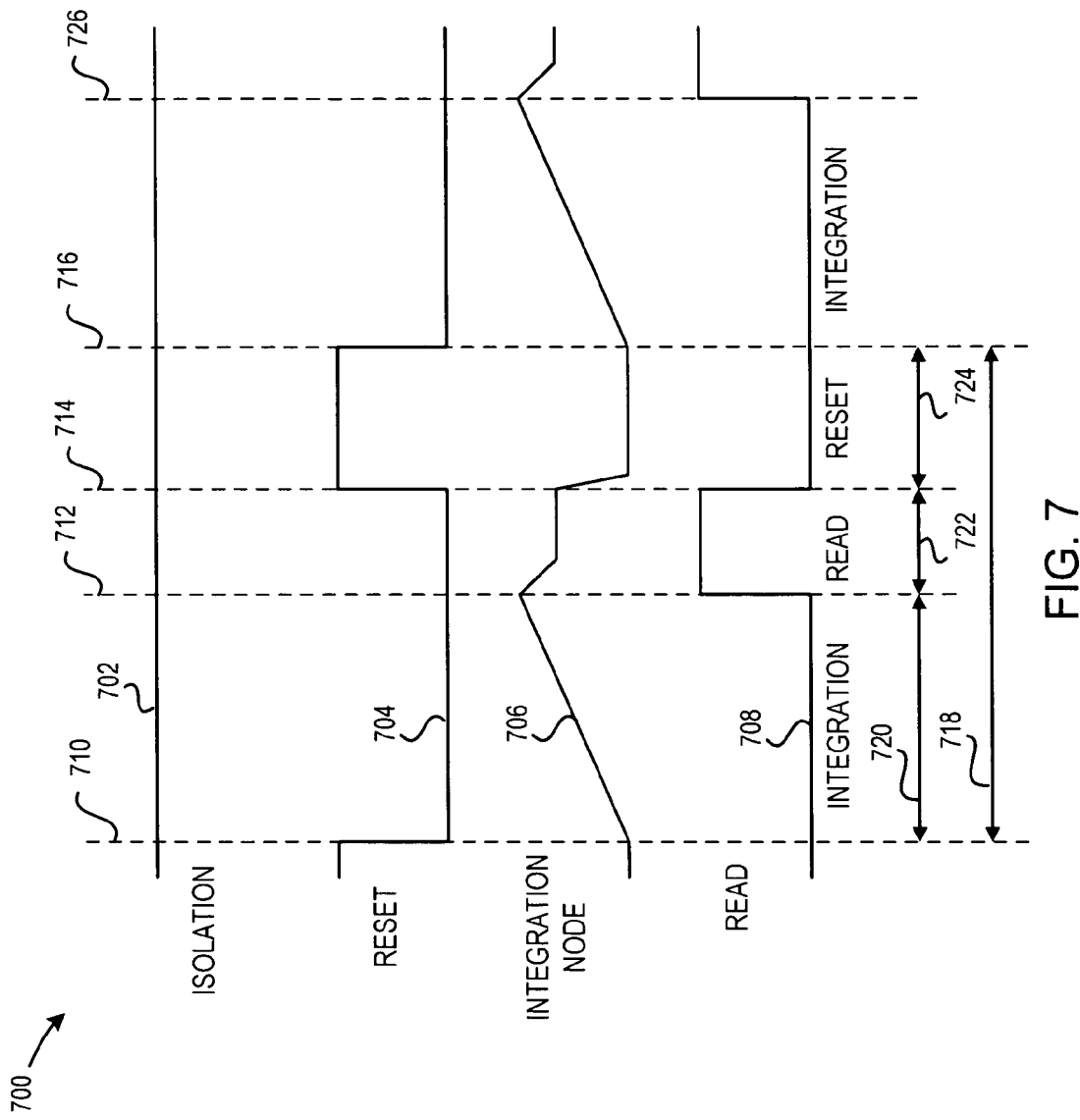
FIG. 7 is a timing diagram illustrating a ripple read method of operation of the max cap unit cell of FIG. 3.

FIG. 7 is a timing diagram illustrating method 700, which is a method of operating max cap unit cell 300 in the ripple read mode. FIG. 7 illustrates relative magnitudes of isolation signal 308, reset signal 312, read signal 322, and the relative magnitude of the voltage on integration node 326 with respect to time. Curve 702 represents the relative magnitude of isolation signal 308; curve 704 represents the relative magnitude of reset signal 312, curve 706 represents the relative magnitude of the voltage on integration node 326; and curve 708 represents the relative magnitude of read signal 322. Dashed lines 710, 712, 714, 716, and 726 represent instances in time.

Method 700 includes executing steps within processing cycle duration 718 one or more times. Max cap unit cell 300 sequentially operates in the following three modes during one processing cycle: integration mode, read mode, and reset mode. Method 700 has a frame rate equal to an inverse of processing cycle time duration 718.

Method 700 may be analyzed by starting with the integration mode, which begins at time 710 and has duration 720. During integration mode time duration 720, isolation switch 306 is closed while reset switch 310 and read switch 320 are open. Integration capacitor 316 is charged by electric current from the photodiode during integration mode time duration 720. Charging of integration capacitor 316 can be appreciated by noting the voltage magnitude of integration node 326 (curve 706) rises linearly during integration mode time duration 720.

Max cap unit cell 300 transitions from the integration mode to the read mode at time 712. At time 712, read switch 320 closes. Read switch 320 remains closed during read mode time duration 722.

At time 714, max cap unit cell 300 transitions from the read mode to the reset mode. Reset switch 310 closes and read switch 320 opens at time 714. The reset mode has time duration 724. At time 716, max cap unit cell 300 transitions from the reset mode back to the integration mode and reset switch 310 opens.

As stated above, max cap unit cell 300 can be operated in the standby mode. In the standby mode, max cap unit cell 300 is not integrating an electric current signal from a respective photodiode, but the photodiode is kept biased. A ROIC including a plurality of max cap unit cells 300 may be operated in a manner such that at least one instance of max cap unit cell 300 is operating in the standby mode while at least one other instance of max cap unit cell 300 is operated in another mode, such as the snap-shot mode or the ripple read mode.

In the standby mode, bias subsystem 302 is active and reset switch 310 is closed to provide a path for the photodiode bias current. Isolated switch 306 is open to isolate the photodiode from integration node 326.

It may be desirable to operate an instance max cap unit cell 300 in the standby mode when the instance is inactive, but other nearby instances of max cap unit cell 300 are active. A photo diode will generate an electric charge when impinged by electromagnetic radiation, even if the photo diode is not electrically powered. Consequentially, if a pixel is powered down, its respective photo diode may generate an electric charge in response to being impinged by incident electromagnetic radiation; this electric charge may create disturbances on nearby pixels resulting in the creation of spatial artifacts in images generated from the pixels' signals. If an inactive photo diode is operated standby mode, any charge that it generates will be shunted to the reset voltage rail which will reduce a likelihood of the charge creating disturbances on nearby pixels.

It may also be desirable to operate an instance of max cap unit cell 300 in the standby mode if the pixel is not currently inactive but may become active in the foreseeable future. An example of such situation is when a subset or a window of an array of pixels is active, the remainder of the array is inactive, and the window is moving within the array, such as to track a fast moving target. Stated in another manner, the identities of the constituent pixels of the window are changing. In this operating mode, a pixel may be required to quickly change from an inactive mode (e.g. the standby mode) to an active mode (e.g. the ripple read mode) in response to the window moving within the array. An instance of max cap unit cell 300 will be able to change from an inactive mode to an active mode more quickly when operating in the standby mode than when operating in the power down mode.

As stated above, max cap unit cell 300 can also be operated in the power down mode. In such mode, max cap unit cell 300 is completely shut off. Bias subsystem 302 is disabled, and reset switch 310, isolation switch 306, and read switch 320 are un-powered. A ROIC including a plurality of max cap unit cells 300 may be operated in a manner such that at least one instance of max cap unit cell 300 is operated in the power down mode while at least one other instance of max cap unit cell 300 is operated in another mode, such as the snap-shot mode or the ripple read mode.

In some applications of ROIC 100, pairs of photodiodes are grouped into a dual photodiode assembly, hereinafter referred to as a photo detector. Each photo detector includes a photodiode optimized to detect a first color of infrared radiation ("first color photodiode") and a photodiode optimized to detect a second color of infrared radiation ("second color photodiode"). In such applications, it may be desirable to group pairs of unit cells into common structures, which will be referred to as integration subsystems, that can be grouped with respective photo detectors.

Figure 8:
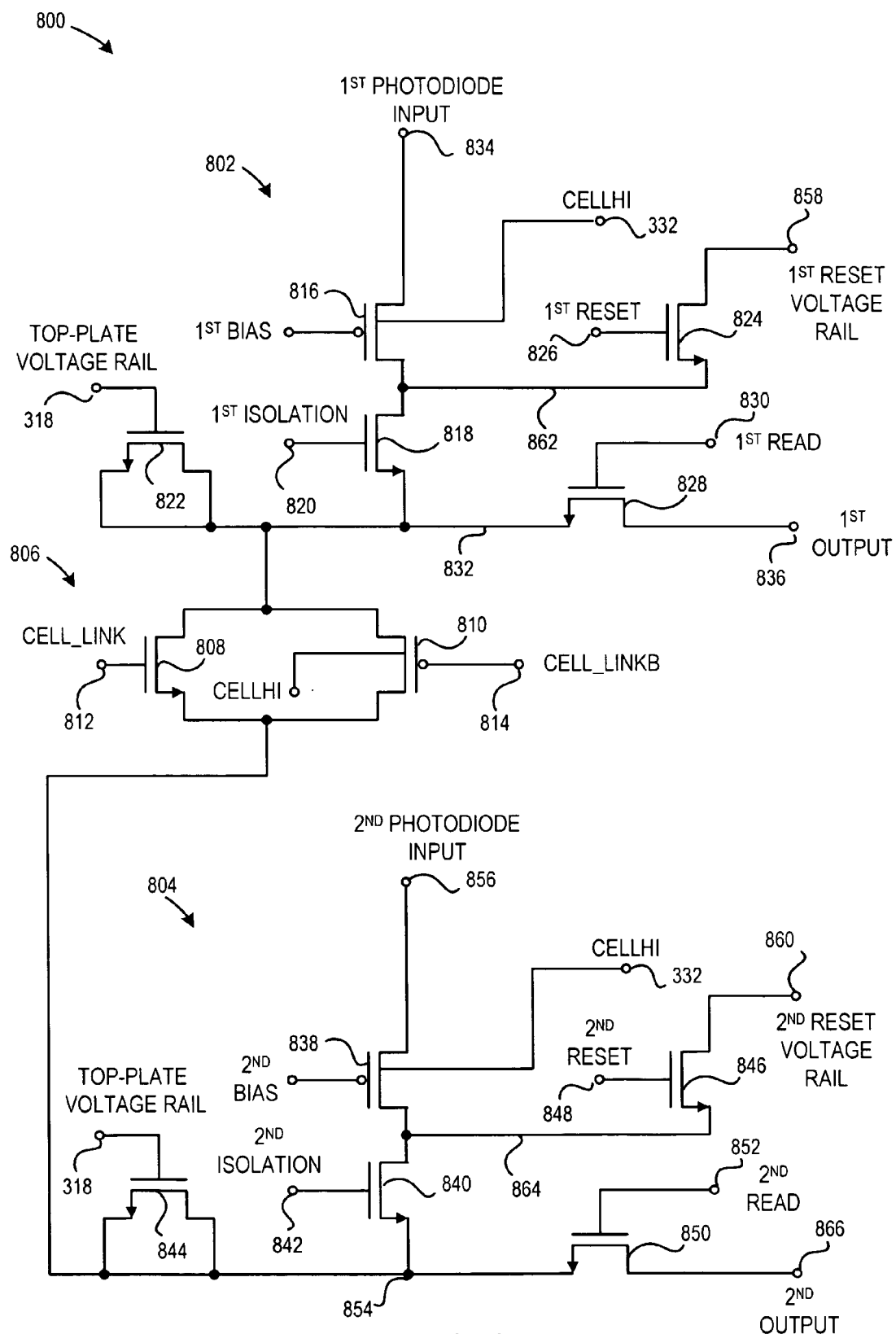
FIG. 8 schematically illustrates an integration subsystem.

FIG. 8 schematically illustrates integration subsystem 800, which includes two instances of max cap unit cell 300, namely first unit cell 802 and second unit cell 804. An embodiment of ROIC 100 may include a plurality of integration subsystems 800, and each integration subsystem 800 may be electrically connected to a photo detector.

First unit cell 802 includes first photodiode input 834, first bias subsystem 816, first reset node 862, first reset switch 824, first isolation switch 818, first integration node 832, first integration capacitor 822, first read switch 828, and first output 836. Second unit cell 804 includes second photodiode input 856, second bias subsystem 838, second reset node 864, second reset switch 846, second isolation switch 840, second integration node 854, second integration capacitor 844, second read switch 850, and second output 866.

First unit cell 802 and second unit cell 804 may be operated in unison or may be operated independently. First bias subsystem 816 may be operated independently of second bias subsystem 838, and first reset switch 824 may be operated independently of second reset switch 846. First isolation switch 818 may be operated independently of second isolation switch 840, and first read switch 828 may be operated independently of second read switch 850. First reset voltage rail 858 may be operated independently of second reset voltage rail 860.

Integration subsystem 800 includes connection subsystem 806, which is operable to connect integration node 832 of first unit cell 802 to integration node 854 of second unit cell 804. When connection subsystem 806 is operating to connect first unit cell 802 and second unit cell 804, both unit cells are operating in a combined "double cap" mode. In the double cap mode, the charge capacity of integration capacitor 822 is combined with the charge capacity of integration capacitor 844.

The double cap mode may be used when an electric current signal is to be integrated from only one of the photodiodes connected to integration subsystem 800, and it desired to increase the effective integration capacitance of the active unit cell. For example, if first unit cell 802 is to be active and second unit cell 804 is to be inactive, the double cap mode may be used to increase the effective integration capacitor charge capacity of first unit cell 802. Conversely, if first unit cell 802 is to be inactive and second unit cell 804 is to be active, the double cap mode may be used to increase the effective integration capacitor charge capacity of second unit cell 804.

In the double cap mode, the active unit cell may be operated in accordance to the methods described with respect to FIGS. 3-7. However, the isolation switch of the unit cell that is inactive is open. The inactive unit cell may optionally be operated in the standby mode wherein its bias subsystem is active and its reset switch is closed. For example, if integration subsystem 800 is to be operated in the double cap mode wherein first unit cell 802 is active and second unit cell 804 is inactive, isolation switch 840 of second unit cell 804 would be open. Optionally, bias subsystem 838 may be operational, and reset switch 846 may be closed. Conversely, if integration subsystem 800 is to be operated in the double cap mode wherein first unit cell 802 is inactive and second unit cell 804 is active, isolation switch 818 of first unit cell 802 would be open. Optionally, bias subsystem 816 may be operational, and reset switch 824 may be closed.

Integration subsystem 800 may be operated in the snap-shot mode, the ripple read mode, the standby mode, and the power down mode in the same manner as max cap unit cell 300. Additionally, integration subsystem 800 may be operated in a snap-shot, double cap mode, and a ripple read, double cap mode.

Figure 9:
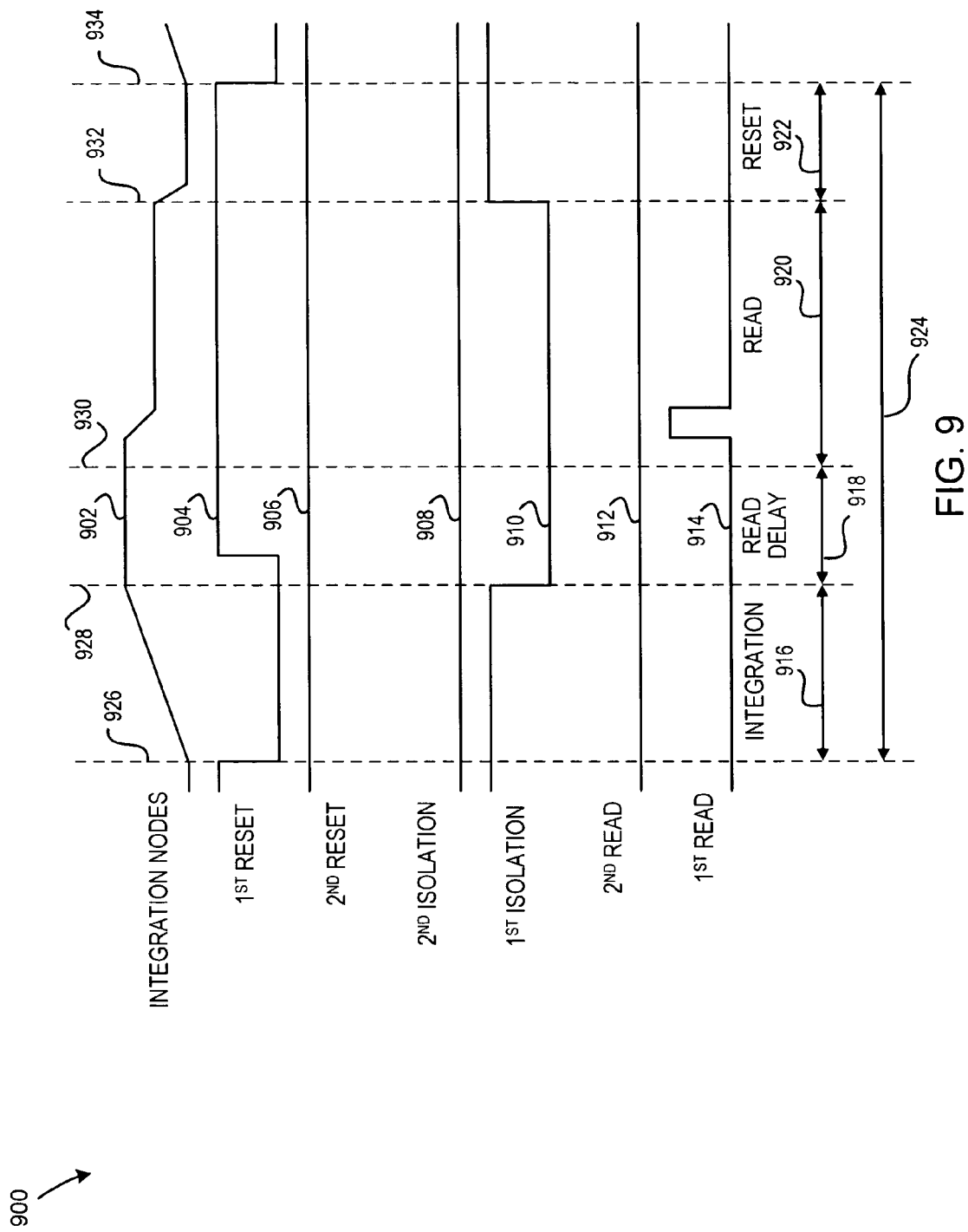
FIG. 9 is a timing diagram illustrating a snap-shot, double cap method of operation of the integration subsystem of FIG. 8.

FIG. 9 is a timing diagram illustrating method 900, which is an embodiment of a method of operating integration subsystem 800 in the snap-shot, double cap mode. FIG. 9 illustrates the situation wherein first unit cell 802 is active and second unit cell 804 is in the standby mode.

FIG. 9 illustrates relative magnitudes of reset signals 826 and 848, isolation signals 820 and 842, read signals 830 and 852, and the relative magnitudes of voltages on integration nodes 832/854 with respect to time. Curve 902 represents the relative voltage magnitudes of integration nodes 832 and 854 (which are combined via connection subsystem 806); curve 904 represents the relative magnitude of first reset signal 826; curve 906 represents the relative magnitude of second reset signal 848; curve 908 represents the relative magnitude of second isolation signal 842; curve 910 represents the relative magnitude of first isolation signal 820; curve 912 represents the relative magnitude of second read signal 852; and curve 914 represents the relative magnitude of first read signal 830. Dashed lines 926, 928, 930, 932, and 934 represent instances in time.

Method 900 includes executing steps within processing cycle duration 924 one or more times. Integration subsystem 800 sequentially operates in the following four modes during one processing cycle: integration mode, read delay mode, read mode, and reset mode. Method 900 has a frame rate equal to an inverse of processing cycle time duration 924.

As stated above, second unit cell 804 is inactive. Consequently, second isolation switch 840 and second read switch 850 remain open. In order for unit cell 804 to operate in the standby mode, second bias subsystem 838 remains active and second reset switch 846 remains closed. Connection subsystem 806 is connecting unit cells 802 and 804 for the duration of method 900.

Method 900 may be analyzed by starting with the integration mode, which begins at time 926 and has duration 916. During the integration mode, first isolation switch 818 is closed while first reset switch 824 and first read switch 828 are open. Integration capacitor 822 is charged by electric current from the photodiode during integration mode time duration 916. Charging of integration capacitor 822 can be appreciated by noting that the voltage magnitude of integration nodes 832/854 rises linearly during integration mode time duration 916.

Integration subsystem 800 transitions from the integration mode to the read delay mode at time 928. At time 928, first isolation switch 818 opens. During read delay mode duration 918, first reset switch 824 closes. In the same manner as discussed with respect to FIG. 5, the read delay mode may be used to synchronize a start of the read mode among a plurality of max cap unit cells 300 of a plurality of integration subsystems 800.

At time 930, integration subsystem 800 transitions from the read delay mode to the read mode. First read switch 828 is closed for a predetermined amount of time during read mode time duration 920. It may be noted that first read switch 828 is closed for a small subset of read mode time duration 920; this is to allow other unit cells which are connected to output 836 an opportunity to be read during read mode time duration 920.

Integration subsystem 800 transitions from the read mode to the reset mode at time 932. First isolation switch 818 also closes at time 932. After reset mode time duration 922 elapses, integration subsystem 800 transitions back to the integration mode at time 934. First reset switch 824 opens at time 934.

Figure 10:
FIG. 10 is a timing diagram illustrating a ripple read, double cap method of operation of the integration subsystem of FIG. 8.

As stated above, integration subsystem 800 may be operated in a ripple read, double cap mode. FIG. 10 is a timing diagram illustrating method 1000, which is an embodiment of a method of operating integration subsystem 800 in the ripple read, double cap mode. FIG. 10 illustrates the situation wherein first unit cell 802 is active while second unit cell 804 is in the standby mode.

FIG. 10 illustrates relative magnitudes of reset signals 826 and 848, isolation signals 842 and 820, read signals 852 and 830, and the relative magnitude of the voltage on integration nodes 832/854 with respect to time. Curve 1002 represents the relative voltage magnitudes of integration nodes 832 and 854 (which are combined via connection subsystem 806); curve 1004 represents the relative magnitude of first reset signal 826; curve 1006 represents the relative magnitude of second reset signal 848; curve 1008 represents the relative magnitude of second isolation signal 842; curve 1010 represents relative magnitude of first isolation signal 820; curve 1012 represents the relative magnitude of second read signal 852; and curve 1014 represents the relative magnitude of first read signal 830. Dashed lines 1024, 1026, 1028, 1030, and 1032 represent instances in time.

Method 1000 includes executing steps within processing cycle duration 1016 one or more times. Integration subsystem 800 sequentially operates in the following three modes during one processing cycle: integration mode, read mode, and reset mode. Method 1000 has a frame rate equal to an inverse of processing cycle time duration 1016.

As stated above, second unit cell 804 is inactive. Consequently, second isolation switch 840 and second read switch 850 remain open. In order for second unit cell 804 to operate in standby mode, second bias subsystem 838 remains active and second reset switch 846 remains closed. Connection subsystem 806 is connecting unit cells 802 and 804 for the duration of method 1000.

Method 1000 may be analyzed by starting with the integration mode, which begins at time 1024 and has duration 1018. During integration mode time duration 1018, first isolation switch 818 is closed while first reset switch 824 and first read switch 828 are open. Integration capacitor 822 is charged by electric current from the photodiode during integration mode time duration 1018. Charging of integration capacitor 822 can be appreciated by noting the voltage magnitude of integration nodes 832/854 (curve 1002) rises linearly during integration mode time duration 1018.

Integration subsystem 800 transitions from the integration mode to the read mode at time 1026. At time 1026, first read switch 828 closes. First read switch 828 remains closed during read mode time duration 1020.

At time 1028, integration subsystem 800 transitions from the read mode to the reset mode. First reset switch 824 closes and first read switch 828 opens at time 1028. The reset mode has time duration 1022. At time 1030, integration subsystem 800 transitions from the reset mode back to the integration mode and first reset switch 824 opens.

Connection subsystem 806 is illustrated as including N-FET cell link switch 808 and P-FET cell link switch 810 connected in parallel. However, any acceptable component or components that are operable to connect integration node 832 to integration node 854 may used in connection subsystem 806. CELL_LINK signal 812 and CELL_LINKB signal 814 are operated in a complementary manner; in other words, one signal is high while the other signal is low.

Figure 11:
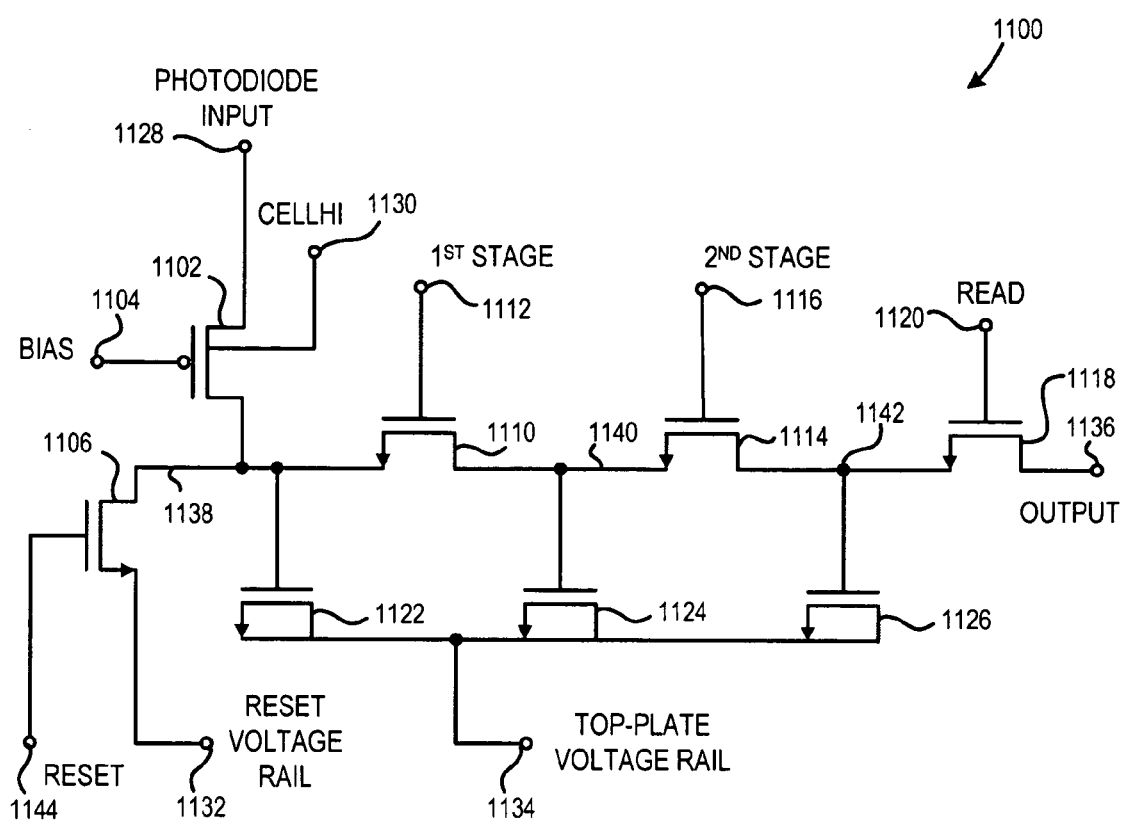
FIG. 11 schematically illustrates a single switch cap unit cell.

FIG. 11 schematically illustrates switch cap unit cell 1100, which is an embodiment of a unit cell that may be used in ROIC 100. For example, switch cap unit cell 1100 may be used for some or all of unit cells 202 of FIG. 2.

Switch cap unit cell 1100 connects to a respective photodiode via photodiode input 1128. Bias subsystem 1102 controls a magnitude of a bias voltage on a photodiode connected to photodiode input 1128 ("photodiode bias voltage"). The magnitude of the photodiode bias voltage may be adjusted by varying bias signal 1104.

Bias subsystem 1102 is shown in FIG. 11 as being implemented using a P-FET with its well connected to CELLHI voltage rail 1130. However, bias subsystem 1102 may be implemented in other acceptable manners, such as by using a CTIA or a BDI circuit. In an embodiment, CELLHI voltage rail 1130 has a direct current voltage magnitude of about 3.3 volts.

Bias subsystem 1102 is connected between photodiode input 1128 and first stage node 1138. Reset switch 1106 is connected between first stage node 1138 and reset voltage rail 1132. Reset switch 1106 is controlled by reset signal 1144. Reset switch 1106 resets switch cap unit cell 1100 by clamping first stage node 1138 to reset voltage rail 1132 when reset switch 1106 is closed. In an embodiment, reset voltage rail 1132 is nominally zero volts, but can be adjusted between zero and 3 volts in approximately 12 millivolt increments.

First capacitor 1122 is connected between first stage node 1138 and top-plate voltage rail 1134. First stage switch 1110 connects first stage node 1138 to second stage node 1140. First stage switch 1110 is controlled by first stage signal 1112.

Second capacitor 1124 is connected between second stage node 1140 and top-plate voltage rail 1134. Second stage switch 1114 connects second stage node 1140 to third stage node 1142. Second stage switch 1114 is controlled by second stage signal 1116.

Third capacitor 1126 is connected between third stage node 1142 and top-plate voltage rail 1134. Read switch 1118 connects third stage node 1142 to output 1136. Read switch 1118 is controlled by read signal 1120. Output 1136 may be connected to a column buffer. Read switch 1118 may be required if a plurality of unit cells are to be read by a common column buffer.

First capacitor 1122, second capacitor 1124, and third capacitor 1126 are implemented in FIG. 1 with N-FETs configured to act as capacitors. However, first capacitor 1122, second capacitor 1124, and third capacitor 1126 may be implemented using any other acceptable type of capacitor. In an embodiment, first capacitor 1122 and third capacitor 1126 have a charge capacity ranging from about 0.1 picofarads to about 0.5 picofarads; second capacitor 1124 has a charge capacity of about 10 times less than the charge capacity of first capacitor 1122 and third capacitor 1126.

In an embodiment, top-plate voltage rail 1134 has a greater voltage magnitude than a supply voltage rail used as a primary power source for switch cap unit cell 1100 in order to increase the charge capacity of first capacitor 1122, second capacitor 1124, and third capacitor 1126. For example, top-plate voltage rail 1134 may have a magnitude of 3.6 volts while the supply voltage rail has a magnitude of 3.3 volts.

In an embodiment, first stage signal 1112, second stage signal 1116, and read signal 1120 have a high state voltage magnitude greater than the supply voltage rail for switch cap unit cell 1100 in order to maximize a dynamic range of switch cap unit cell 1100. For example, first stage signal 1112, second stage signal 1116, and read signal 1120 may have a high state voltage magnitude of 3.6 volts while the supply voltage rail has a magnitude of 3.3 volts.

Reset switch 1106, first stage switch 1110, second stage switch 1114, and read switch 1118 are all implemented in FIG. 11 using N-FETs. However, reset switch 1106, first stage switch 1110, second stage switch 1114, and read switch 1118 may be implemented using any acceptable one or more components that can operate as a switch.

As was stated above, it is desirable to optimize a unit cell for its application. Switch cap unit cell 1100 has several parameters that can be adjusted to optimize switch cap unit cell 1100 for its application.

The charge capacity of first capacitor 1122, second capacitor 1124, and/or third capacitor 1126 may be optimized for the expected flux density of infrared radiation to be captured by the photodiode connected to switch cap unit cell 1100. As was discussed above with respect to max cap unit cell 300, it is generally desirable that capacitor charge capacity be proportional to the flux density of infrared radiation expected to be captured by the photodiode.

The photodiode bias voltage can also be optimized for the photodiode. As stated above, the photodiode bias voltage can be adjusted by varying bias signal 1104.

Switch cap unit cell 1100 can also be optimized for its application by varying its operating mode, frame rate, and integration time. Like max cap unit cell 300, switch cap unit cell 1100 operates in a periodic manner—it processes a current signal from a photodiode in successive processing cycles. Frame rate is defined in the same manner with respect to switch cap unit cell 100 as it is defined with respect to max cap unit cell 300. However, the definition of integration time with respect to switch cap unit cell 1100 varies with the operating mode of switch cap unit cell 1100, which will be discussed in more detail below.

Switch cap unit cell 1100 may be operated in modes including a snap-shot mode, averaging mode, a snap-shot, direct integration mode, a standby mode, or a power down mode. In the snap-shot, averaging mode, an electric current signal from a photodiode is integrated a plurality of times during a single processing cycle. Accordingly, each integration time duration is relatively short. As a result, operation of switch cap unit cell 1100 in the snap-shot, averaging mode may be desirable if switch cap unit cell 1100 is used in an application wherein there is a danger of the capacitors of switch cap unit cell 1100 saturating, such as when switch cap unit cell 1100 is used in a LWIR application.

Figure 12:
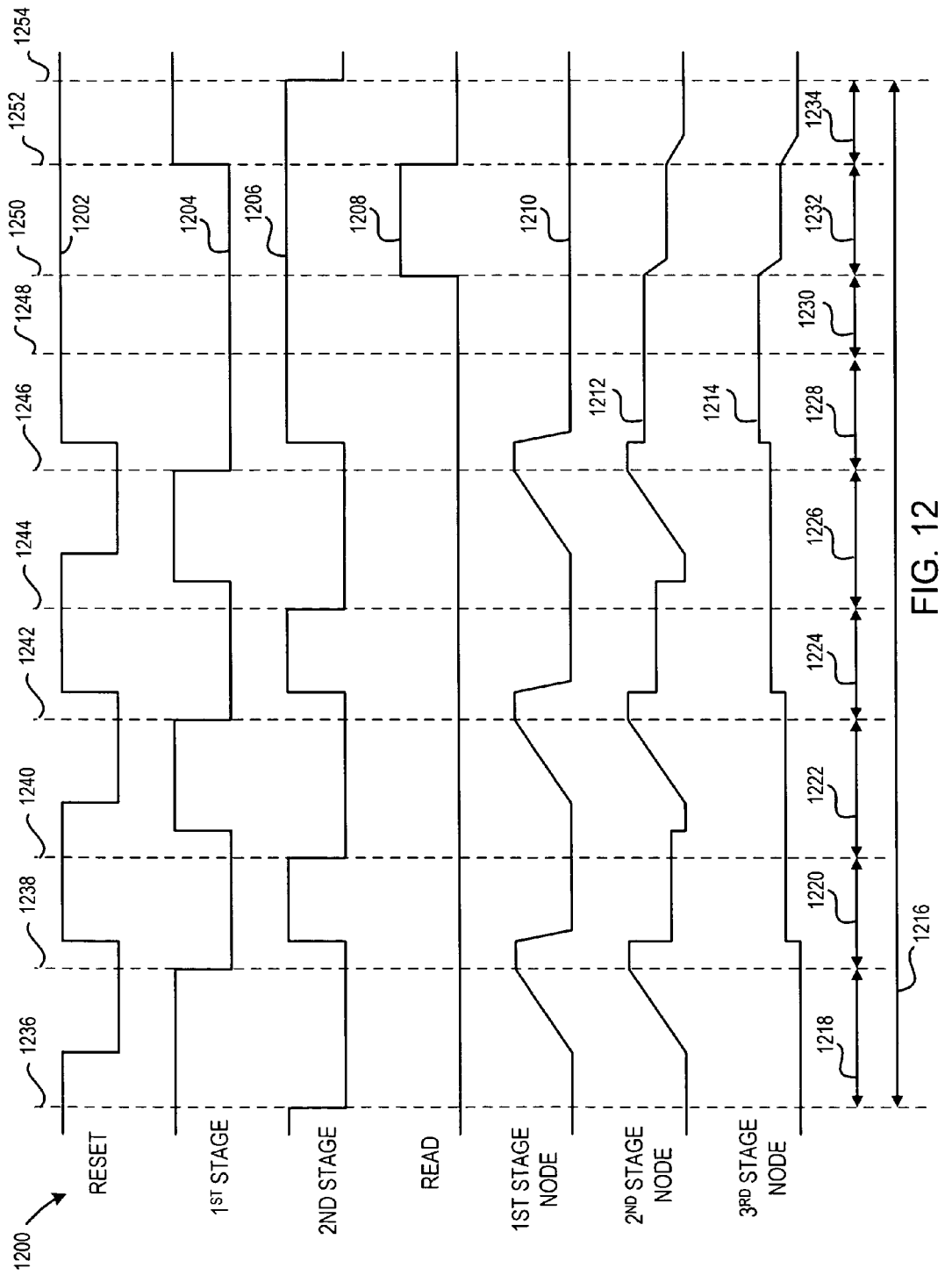
FIG. 12 is a timing diagram illustrating a snap-shot, averaging method of operation of the switch cap unit cell of FIG. 11.

FIG. 12 is a timing diagram illustrating method 1200, which is an embodiment of a method of operating switch cap unit cell 100 in a snap-shot, averaging mode. FIG. 12 illustrates one processing cycle of method 1200, wherein each processing cycle includes three integration mode occurrences. However, other embodiments of method 1200 may have a different number of integration mode occurrences.

FIG. 12 illustrates the relative magnitude of reset signal 1144, first stage signal 1112, second stage signal 1116, read signal 1120, first stage node 1138 voltage, second stage node 1140 voltage, and third stage node 1142 voltage with respect to time. Curve 1202 represents the relative magnitude of reset signal 1114; curve 1204 represents the relative magnitude of first stage signal 1112; curve 1206 represents the relative magnitude of second stage signal 1116; curve 1208 represents the relative magnitude of read signal 1120; curve 1210 represents the relative magnitude of the voltage of first stage node 1138; curve 1212 represents the relative magnitude of the voltage of second stage node 1140; and curve 1214 represents the relative magnitude of the voltage of third stage node 1142. Dashed lines 1236, 1238, 1240, 1242, 1244, 1246, 1248, 1250, 1252, and 1254 represent instances in time.

As stated above, switch cap until cell 1100 operates in a periodic manner. Accordingly, method 1200 includes executing steps within processing cycle duration 1216 one or more times. The frame rate of method 1200 is the inverse of processing cycle time duration 1216.

Method 1200 may be appreciated considering the initial integration mode, which begins at time 1236 and has duration 1218. During this mode, first stage switch 1110 is closed, second stage switch 1114 is open, and read switch 1118 is open. Reset switch 1106 is closed at the beginning of the initial integration mode, but closes during its duration 1218.

At time 1238, switch cap unit cell 1100 transitions from the initial integration mode to the initial reset mode, which has duration 1220. At time 1238, first stage switch 1110 opens. At about a same time during the initial reset mode duration 1220, reset switch 1106 and second stage switch 1114 close.

At time 1240, switch cap unit cell 1100 transitions from the initial reset mode to the integration mode, which has duration 1222. Second stage switch 1114 opens at time 1240, and first stage switch 1110 closes during duration 1222. Reset switch 1106 opens during duration 1222 after first stage switch 1110 closes.

At time 1242, switch cap unit cell 1100 transfers to the reset mode, which has duration 1224. At time 1244, unit cell 1100 transitions back to the integration mode, which has duration 1226. At time 1246, unit cell 1100 transitions back to the reset mode, which has duration 1228.

At time 1248, switch cap unit cell 1100 transitions from the reset mode to the read delay mode, which has duration 1230. In the same manner as discussed with respect to FIGS. 5 and 9, the read delay mode may be used to synchronize a start of the read mode among a plurality of switch cap unit cells 1100. Switch cap unit cell 1100 transitions from the read delay mode to the read mode at time 1250. Read switch 1118 closes at time 1250 and remains closed for duration 1232 of the read mode. At time 1252, switch cap unit cell 1100 transitions from the read mode to the post read mode, which has duration 1234. At time 1252, first stage switch 1110 closes and read switch 1118 opens. The post read mode terminates at time 1254 with the opening of second stage switch 1114. Method 1200 may then return to the initial integration mode.

As can be observed by inspection of the magnitude of the voltage on first stage node 1138 (curve 1210 of FIG. 12), capacitor 1122 integrates an electric current from a photodiode during each integration cycle. After each integration cycle, the charge on capacitor 1122 is transferred to capacitors 1124 and 1126; capacitor 1122 is subsequently reset. Consequently, at the end of each processing cycle, capacitor 1126 contains as representation of the total charge collected by capacitor 1122 during a processing cycle.

As stated above, switch cap unit cell 1100 may be operated in the snap-shot, direct integration mode. Such mode is essentially the same as the snap-shot mode illustrated in FIG. 5. It may be desirable to operate switch cap unit cell 1110 in the snap-shot, direct integration mode in applications where its respective photodiode will capture infrared radiation with a relatively low flux density.

Figure 13:
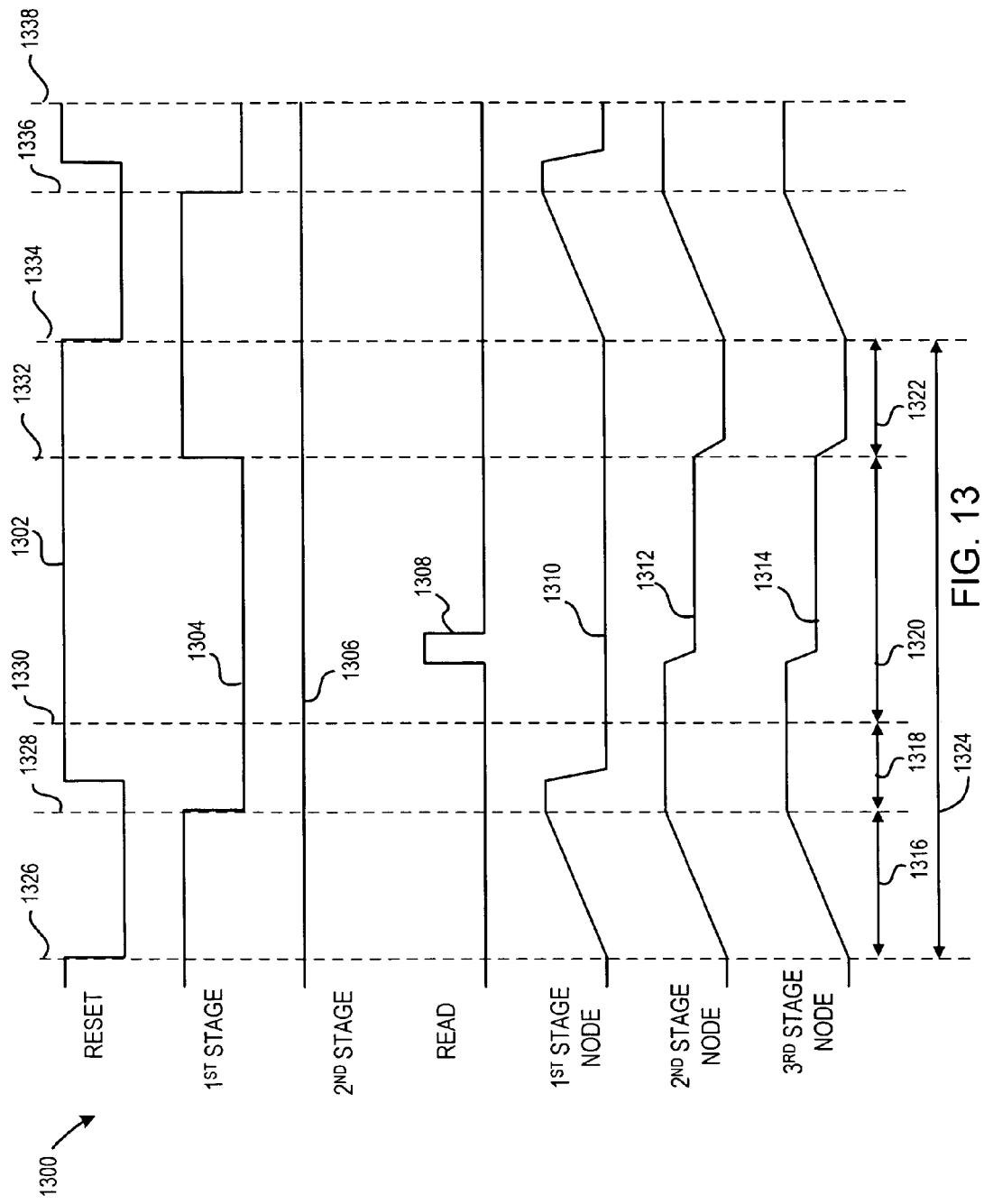
FIG. 13 is a timing diagram illustrating a snap-shot, direct integration method of operation of the switch cap unit cell of FIG. 11.

FIG. 13 is a timing diagram illustrating method 1300, which is a method of operating switch cap unit cell 1100 in a snap-shot, direct integration mode. FIG. 13 illustrates relative magnitudes of reset signal 1144, first stage signal 1112, second stage signal 1116, and read signal 1120, as well as the relative magnitudes of the voltages on first stage node 1138, second stage node 1140, and third stage node 1142 with respect to time. Curve 1302 represents the relative magnitude of reset signal 1144; curve 1304 represents the relative magnitude of first stage signal 1112; curve 1306 represents the relative magnitude of second stage signal 1116; curve 1308 represents the relative magnitude of read signal 1120; curve 1310 represents the relative voltage magnitude of first stage node 1138; curve 1312 represents the relative voltage magnitude of second stage node 1140; and curve 1314 represents the relative magnitude of third stage node 1314. Dashed lines 1326, 1328, 1330, 1332, 1334, 1336, and 1338 represent instances in time.

As stated above, switch cap until cell 1100 operates in a periodic manner. Accordingly, method 1300 includes executing steps within processing cycle duration 1324 one or more times. Switch cap unit cell 1100 sequentially operates in the following four modes during one processing cycle: integration mode, read delay mode, read mode, and reset mode. Method 1300 has a frame rate equal to an inverse of processing cycle time duration 1324.

Second stage switch 1114 remains closed for the duration of method 1300. Method 1300 may be appreciated by considering the status of switch cap unit cell 1100 at time 1326 wherein the integration mode begins. During the integration mode, which has duration 1316, first stage switch 1110 is closed while reset switch 1106 and read switch 1118 are open. During the integration mode, capacitors 1122, 1124, and 1126 are charged by electric current from the photodiode connected to switch cap unit cell 1100. Charging of the capacitors can be appreciated by noting the voltage magnitude of first stage node 1138, second stage node 1140, and third stage node 1142 rises linearly during integration mode time duration 1316.

Switch cap unit cell 1100 transitions from the integration mode to the read delay mode at time 1328. At time 1328, first stage switch 1110 opens. During read delay mode duration 1318, reset switch 1106 closes. In the same manner as discussed with respect to FIGS. 5, 9, and 12 the read delay mode may be used to synchronize a start of the read mode among a plurality of switch cap unit cells 1100.

At time 1330, switch cap unit cell 1100 transitions from the read delay mode to the read mode. Read switch 1118 is closed for a predetermined amount of time during read mode time duration 1320. It may be noted that read switch 1118 is closed for a small subset of read mode time duration 1320; this is to allow other unit cells which are connected to output 1136 an opportunity to be read during read mode time duration 1320.

Switch cap unit cell 1100 transitions from the read mode to the reset mode at time 1332. First stage switch 1110 also closes at time 1332. After reset mode time duration 1322 elapses, switch cap unit cell 1100 transitions back to the integration mode with the opening of reset switch 1106.

As stated above, switch cap unit cell 1100 can be operated in a standby mode. In such mode, switch cap unit cell 1100 is not integrating current from a respective photodiode, but its keeps the photodiode biased. In standby mode, bias subsystem 1102 is active and reset switch 1106 is closed to provide a path for photodiode bias current. First stage switch 1110 is open to isolate the photodiode from the remainder of switch cap unit cell 1100.

It may be desirable to operate an inactive instance of switch cap unit cell 1100 in the standby mode when other nearby instances of switch cap unit cell 1100 are active in order to prevent the inactive instance from interfering with one or more active instances, as discussed above with respect to max cap unit cell 300. Additionally, it may be desirable to operative an inactive instance of switch cap unit cell 1100 in the standby mode if the instance is expected to become active in the foreseeable future, as discussed above with respect to max cap unit cell 1100.

As was stated above, switch cap unit cell 1100 can also be operated in a power down mode. In such mode, switch cap unit cell 1100 is completely shut off. Bias subsystem 1102 is disabled, and reset switch 1106, first stage switch 1110, second stage switch 1114, and read switch 1118 are un-powered.

In an embodiment, an operating mode of switch cap unit cell 1100 may be determined based on the flux density of infrared radiation captured by the photodiode connected to the unit cell. If the flux density is below a predetermined threshold, switch cap unit cell 1100 may be operated in the snap-shot, direct integration mode. Conversely, if the flux density is above the predetermined threshold, switch cap unit cell 1100 may be operated in the snap-shot, averaging mode. The number of integration mode occurrences per processing cycle, also referred to as the number of averaging cycles per frame, can be based on an amount by which the flux density exceeds the predetermined threshold.

ROIC 100 may include a plurality of switch cap unit cells 1100. Two switch cap unit cells 1100 may be grouped into an integration subsystem, similar to that of integration subsystem 800 of FIG. 8.

All instances of switch cap unit cells 1100 may be operated in the same mode. However, different instances of switch cap unit cells 1100 may be operated in different modes. For example, some instances of switch cap unit cell 1100 may be operated in the snap-shot, averaging mode while other instances may be operated in the power down mode or the standby mode. As another example, some instances of switch cap unit cell 1100 may be operated in the snap-shot, direct integration mode while other instances may be operated in the power down or the standby mode. As a further example, some instances of switch cap unit cell 1100 may be operated in the snap-shot, averaging mode, while other instances of switch cap unit cell 1100 may be operated in the snap-shot, direct integration mode. Furthermore, even if all instances of switch cap unit cells 1100 operate in the snap-shot averaging mode, the number of averaging cycles per frame may vary among the instances of switch cap unit cell 1100. For example, a first instance of switch cap unit cell 1100 may be optimized to operate in a LWIR application by having a first number of averaging cycles per frame, and a second instance of switch cap unit cell 1100 may be optimized to operate in a MWIR application by having a second number of averaging cycles per frame.

Figure 14:
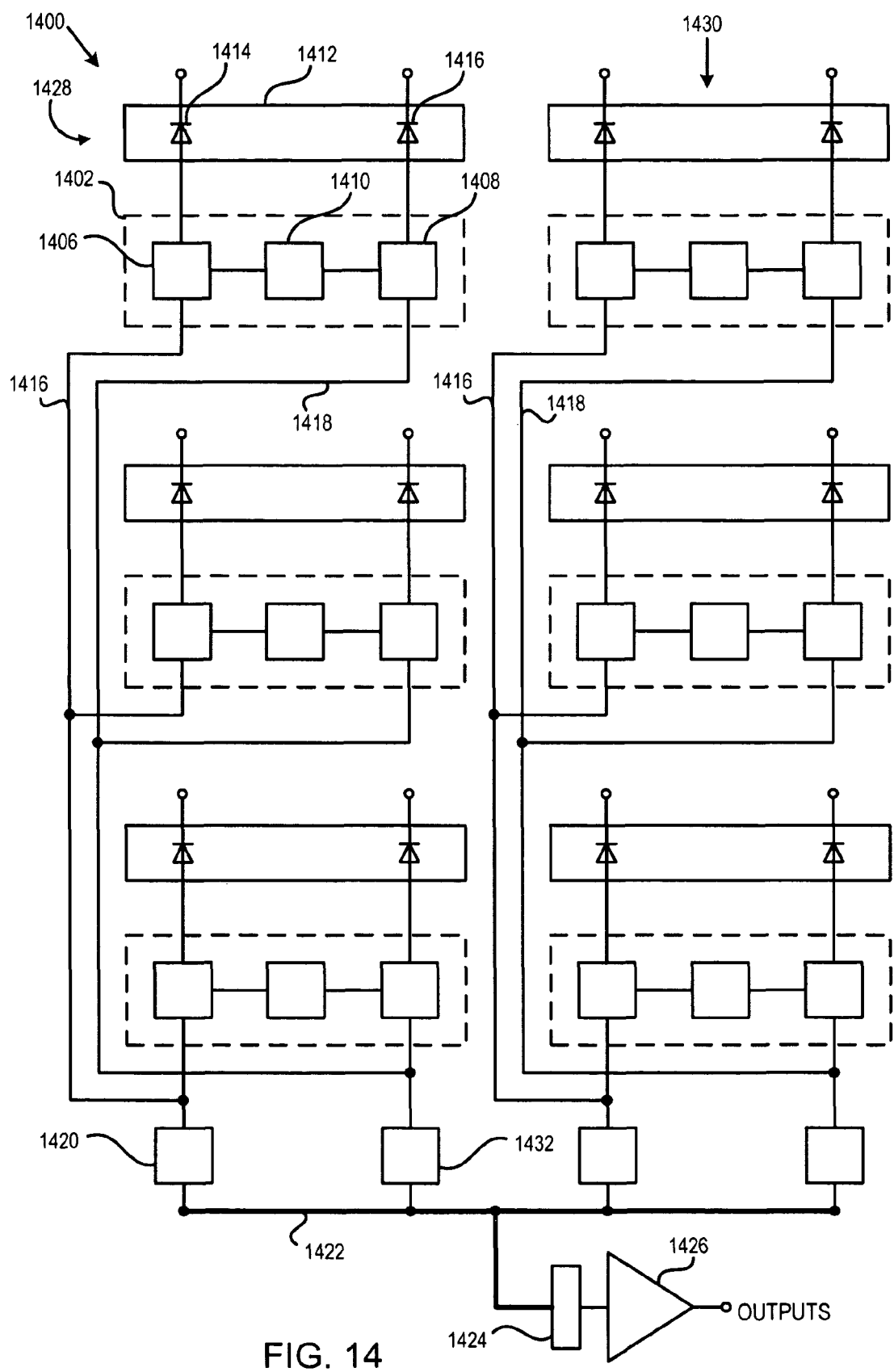
FIG. 14 schematically illustrates a FPA.

FIG. 14 schematically illustrates FPA 1400, which includes an embodiment of ROIC 100. FPA 1400 is optimized to capture infrared radiation of two different colors, and includes a plurality of photo detectors 1412 arranged in a grid. The grid includes a plurality of horizontal rows 1428 of photo detectors 1412, and plurality of vertical columns 1430 of photo detectors 1412. Although FPA 1400 is illustrated as having six photo detectors 1412, FPA 1400 may have any quantity of photo detectors 1412. Accordingly, FPA 1400 may have any quantity of rows 1428 and any quantity of columns 1430.

Each photo detector 1412 has first color photodiode 1414 and second color photodiode 1416. In an embodiment, first color photodiode 1414 is optimized to capture LWIR, and second color photodiode 1416 is optimized to capture MWIR.

The ROIC of FIG. 14 includes a plurality of integration subsystems 1402, first buses 1416, second buses 1418, first column buffers 1420, second column buffers 1432, output drivers 1426, as well as column buffer output bus 1422 and control switching subsystem 1424.

Each integration subsystem 1402 is coupled to a respective photo detector 1412. Each integration subsystem 1402 includes first unit cell 1406 coupled to a respective first color photodiode 1414 and second unit cell 1408 coupled to a respective second color photodiode 1416. A combination of an instance of first unit cell 1406 and an instance of first color photodiode 1414 is referred to as a first pixel; a combination of an instance of second unit cell 1408 and an instance of second color photodiode 1416 is referred to as a second pixel. Accordingly, FPA 1400 includes a grid of first and second pixels corresponding to the grid of photo detectors 1412. However, because each photo detector 1412 (and each integration subsystem 1402) support a first pixel and a second pixel, each row 1428 and each column 1430 includes twice as many pixels as photo detectors 1412.

Some embodiments of integration subsystem 1402 include connection subsystem 1410 that is operable to connect an integration node of first unit cell 1406 to an integration node of second unit cell 1408. In an embodiment, integration subsystem 1402 is integration subsystem 800 of FIG. 8, which includes two instances of max cap unit cell 300. In another embodiment of integration subsystem 1402, first unit cell 1406 and second unit cell 1408 are both switch cap unit cells 1100. In yet another embodiment of integration subsystem 1402, one unit cell is an instance of switch cap unit cell 1100 while another unit cell is an instance of max cap unit cell 300. For example, first unit cell 1406 may be an instance of switch cap unit cell 1100 while second unit cell 1408 may be an instance of max cap unit cell 300.

Each first column buffer 1420 is connected to each first unit cell 1406 in its vertical column 1430 by an instance of first bus 1416. Each second column buffer 1432 is connected to each second unit cell 1408 in its vertical column 1430 by an instance of second bus 1418. Column buffer output bus 1422 connects an output of each first column buffer 1420 and an output of each second column buffer 1432 to control switching subsystem 1424. Control switching subsystem 1424 interfaces first column buffers 1420 and second column buffers 1432 to output drivers 1426. Control switching subsystem 1424 controls when a first or second column buffer accesses one of the output drivers 1426; such control may be necessary if there are a greater quantity of column buffers 1420 and 1432 than output drivers 1426.

FPA 1400 may be operated in a plurality of modes, and an operating mode for first unit cells 1406 may be different from an operating mode for second unit cells 1408. One or more operating modes can be selected such that FPA 1400 best meets the needs of its application.

FPA 1400 may be operated in double cap, double rate mode. Double cap, double rate mode may be used if all unit cells are instances of max cap unit cell 300 or switch cap unit cell 1100, or if some unit cells are instances of max cap unit cell 300, and other unit cells are instances of switch cap unit cell 1100. In double cap, double rate mode, data is simultaneously read from two adjacent rows of first pixels or second pixels. Data is read from an odd number row of first pixels with either first bus 1416 or second bus 1418, and data is simultaneously read from an adjacent even number row of first pixels using the bus not being used to read the odd number row. Similarly, data is read from an odd number row of second pixels with either first bus 1416 or second bus 1418, and data is simultaneously read from an adjacent even number row of second pixels using the bus not being used to read the odd number row. The first pixels and the second pixels are not read simultaneously; first bus 1416 and second bus 1418 are both dedicated to reading solely the first pixels or the second pixels during a given read time.

In double cap, double rate mode, connection subsystem 1410 is connecting the integration node of first unit cell 1406 to the integration node of second unit cell 1408 in each active integration subsystem 1402. Stated in another manner, the integration node of each active first pixel is connected to the integration node of a respective second pixel via an instance of connection subsystem 1410. As a result, first bus 1416 is able to read a second unit cell 1408 through integration subsystem 1410, and second bus 1418 is able to read a first unit cell 1406 through integration subsystem 1410. No additionally switches are required to implement double cap, double rate mode in FPA 1400.

Operating FPA 1400 in double cap, double rate mode doubles its frame rate. Consequently, when operating FPA 1400 in double cap, double rate mode, a given column of pixels, and therefore the entire grid of first and second pixels, may be read in half of the amount of time than they would be read in other modes.

FPA 1400 may be operated in a sequential read mode. Such mode may be used if all unit cells are instances of max cap unit cell 300 or switch cap unit cell 1100, or if some unit cells are instances of max cap unit cell 300, and other unit cells are instances of switch cap unit cell 1100.

In sequential read mode, the integration mode time durations of the first pixels and second pixels are significantly different. Consequentially, one set of pixels has completed its integration mode significantly before the other set of pixels has completed its integration mode. In sequential read mode, the set of pixels that has completed its integration mode is read while the remaining set of pixels is still operating in its integration mode. The remaining set of pixels is then read after it has completed its integration mode. Stated simply, the set of pixels with a shorter integration mode time duration is read after it completes its integration mode, and the set of pixels with a longer integration mode time duration is read after it completes its integration mode time duration.

In another embodiment of the sequential read mode, the set of pixels with a shorter integration mode time duration may execute a plurality of processing cycles during a single processing cycle of the set of pixels with a longer integration mode time duration. For example, the first set of pixels may complete two snap-shop processing cycles while the second set of pixels completes a single snap-shot processing cycle.

In an additional embodiment of sequential read mode, the first set of pixels and/or the second set of pixels may be simultaneously read by both first bus 1416 and second bus 1418. Such simultaneous reading by both buses is possible if first unit cells and/or second unit cells are connected to both first bus 1416 and second bus 1418. Examples of unit cells that may be connected to two buses are discussed below with respect to FIGS. 15 and 16.

It may be desirable to operate FPA 1400 in sequential read mode if FPA 1400 is configured to capture infrared radiation of two colors having significantly different flux densities. For example, if the first pixels are configured to process LWIR, and the second pixels are configured to process MWIR, the first pixels may be configured to have a significantly shorter integration mode time duration than the second pixels. Accordingly, the first pixels may be read before the second pixels, and the first pixels may execute a plurality of processing cycles during a single processing cycle of the second pixels.

FPA 1400 may be operated in a frame rate optimization mode. In this mode, the frame rate of each unit cell is optimized for its application. For example, if the first pixels are optimized to capture LWIR, and the second pixels are optimized to capture MWIR, the frame rate of first unit cells 1406 would be set higher than the frame rate of second unit cells 1408.

By way of example and not of limitation, FPA 1400 may be configured to operate in a frame rate optimization mode as follows. FPA 1400 is configured such that each horizontal row 1428 has 640 active first and second pixels, and each vertical column 1430 has 480 active first and second pixels. Pixels that are not being used may be made inactive by placing their respective unit cells in the standby or the power down modes. The frame rate of each first unit cell 1406 is set to about 120 hertz, and the integration mode time duration of each first unit cell 1406 is limited to a maximum value of about 1.7 milliseconds. The frame rate of each second unit cell 1408 is set to about 60 hertz, and the integration mode time duration of each second unit cell 1408 is limited to a maximum value of about 10 milliseconds.

The quantities of active first pixels and second pixels may be independently adjusted to optimize FPA 1400 for its application. The quantity of active first pixels may be referred to as a first window size, and the quantity of second active pixels may be referred to as a second window size.

As an example, FPA 1400 may be operated in a narrow field of view ("FOV") LWIR, wide FOV MWIR mode. In such mode, a relatively small quantity of pixels are used to capture LWIR, and a relatively large quantity of pixels are used to capture MWIR. However, the frame rate of the pixels capturing LWIR is relatively large, and the frame rate of the pixels capturing MWIR is relatively small.

By way of example and not of limitation, FPA 1400 may be configured to operate in the narrow FOV LWIR, wide FOV MWIR mode as follows. The first pixels are configured to process LWIR, and the second pixels are configured to process MWIR. FPA 1400 is configured such that each horizontal row 1428 includes 128 active first pixels and 640 active second pixels. FPA 1400 is configured such that each vertical column 1430 includes 128 active first pixels and 480 active second pixels. The frame rate of each first unit cell 1406 is set to about 480 hertz, and the integration mode time duration of each first unit cell is set to about 0.3 milliseconds. The frame rate of each second unit cell 1408 is set to about 60 hertz, and the integration mode time duration of each second unit cell 1408 is set to about 10 milliseconds.

FPA 1400 may be operated in a wide FOV LWIR, narrow FOV, MWIR mode. In such mode, a relatively large quantity of pixels are used to capture LWIR, and a relatively small quantity of pixels are used to capture MWIR. However, the frame rate of the pixels capturing LWIR is relatively small, and the frame rate of the pixels capturing MWIR is relatively large.

By way of example and not of limitation, FPA 1400 may be configured to operate in the wide FOV LWIR, narrow FOV, MWIR mode as follows. The first pixels are configured to process LWIR, and the second pixels are configured to process MWIR. FPA 1400 is configured such that each horizontal row 1428 includes 640 active first pixels and 128 active second pixels. FPA 1400 is configured such that each vertical column 1430 includes 480 active first pixels and 128 active second pixels. The frame rate of each first unit cell 1406 is set to about 60 hertz, and the integration mode time duration of each first unit cell is set to about 0.5 milliseconds. The frame rate of each second unit cell 1408 is set to about 120 hertz, and the integration mode time duration of each second unit cell 1408 is set to about 6.6 milliseconds.

FPA 1400 may be operated in a MWIR sensitivity optimization mode. In such mode, unit cells associated with pixels capturing LWIR are operated in the snap-shot mode while unit cells associated with pixels capturing MWIR are operated in the ripple read mode.

By way of example and not of limitation, FPA 1400 may be configured to operate in the MWIR sensitivity optimization mode as follows. The first pixels are configured to process LWIR, and the second pixels are configured to process MWIR. FPA 1400 is configured such that each horizontal row 1428 has 640 active first and second pixels and each vertical column 1430 has 480 active first and second pixels. The frame rate of each first unit cell 1406 is set to about 60 hertz, and the integration mode time duration of each first unit cell is set about 0.5 milliseconds. The frame rate of each second unit cell 1408 is set to about 60 hertz, and the integration mode time duration of each second unit cell 1408 is limited to a maximum value of about 16.4 milliseconds.

FPA 1400 may be operated in a half resolution mode, wherein solely every second pixel of every second horizontal row 1428 of pixels is active. By way of example and not of limitation, FPA 1400 may be configured to operate in the half resolution mode as follows. The first pixels are configured to process LWIR, and the second pixels are configured to process MWIR. FPA 1400 is configured such that each horizontal row 1428 has 640 active first and second pixels, and each vertical column 1430 has 480 active first and second pixels. The frame rate of each first unit cell 1406 is set to about 240 hertz, and the integration mode time duration of each first unit cell 1406 is set to about 0.5 milliseconds. The frame rate of each second unit cell 1408 is set to about 60 hertz, and the integration mode time duration of each second unit cell 1408 is set to about 13.4 milliseconds.

FPA 1400 may be operated in a quarter resolution mode, wherein solely every fourth pixel of every fourth horizontal row 1428 is active. By way of example and not of limitation, FPA 1400 may be configured to operate in the quarter resolution mode as follows. The first pixels are configured to process LWIR, and the second pixels are configured to process MWIR. FPA 1400 is configured such that each horizontal row 1428 has 640 active first and second pixels and each vertical column 1430 has 480 active first and second pixels. The frame rate of each first unit cell 1406 is set to about 480 hertz, and the integration mode time duration of each first unit cell 1406 is set to about 0.43 milliseconds. The frame rate of each second unit cell 1408 is set to about 60 hertz, and the integration mode time duration of each second unit cell 1408 is set to about 15 milliseconds.

In an embodiment of FPA 1400 where first unit cell 1406 and/or second unit cell 1408 are an instance of switch cap unit cell 1100, an operating mode of any instance of switch cap unit cell 1100 may be determined from the flux density of infrared radiation captured by the photodiode connected to the unit cell. If the flux density is below a predetermined threshold, switch cap unit cell 1100 may be operated in the snap-shot, direct integration mode. Conversely, if the flux density is above the predetermined threshold, switch cap unit cell 1100 may be operated in the snap-shot, averaging mode.

Figure 15:
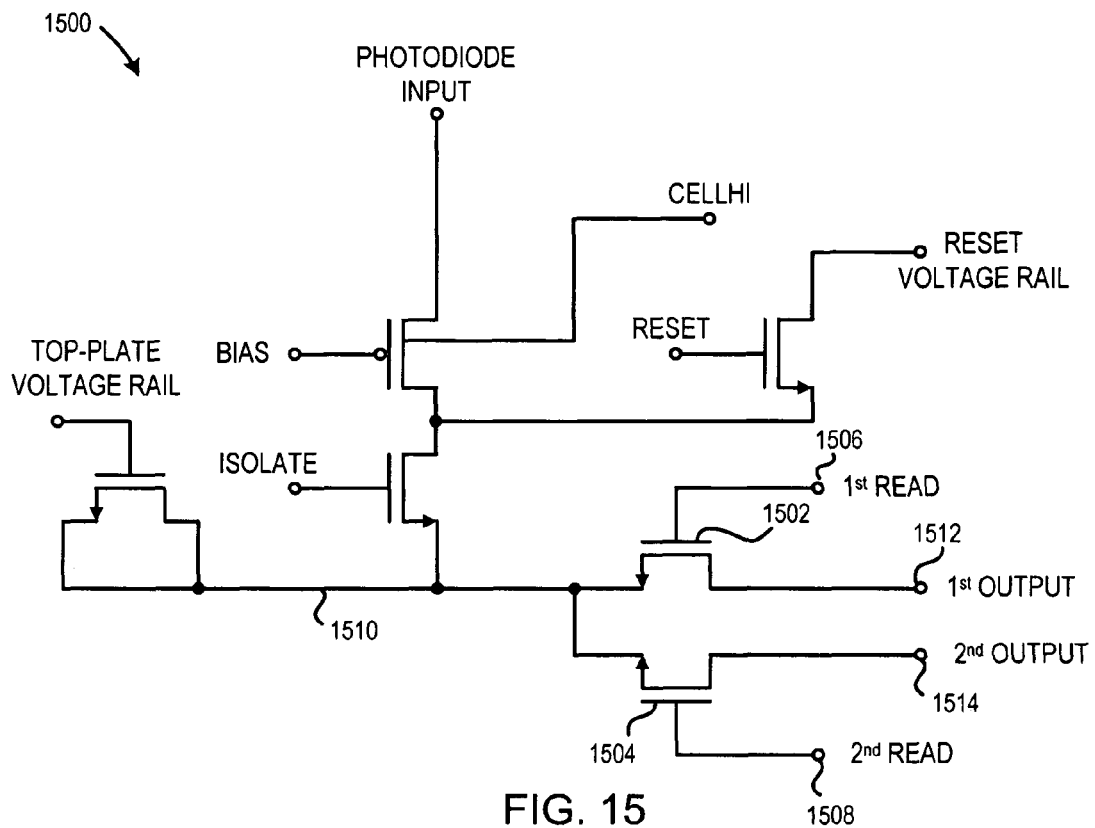
FIG. 15 schematically illustrates a single max cap unit cell operable to be simultaneously read by two data buses.

FIG. 15 schematically illustrates single max cap unit cell 1500, which is an alternative embodiment of max cap unit cell 300. Max cap unit cell 1500 is identical to max cap unit cell 300 with the exception that max cap unit cell 1500 includes two read switches, first read switch 1502 and second read switch 1504. First read switch 1502 is controlled by first read signal 1506, and second read switch 1504 is controlled by second read signal 1508. First read switch 1502 and second read switch 1504 may operate independently or in unison.

First read switch 1502 connects integration node 1510 to first output 1512, and second read switch 1504 connects integration node 1510 to second output 1514. Consequently, integration node 1510 may be read by a subsystem (e.g. a column buffer) on first output 1512 and/or second output 1514. Integration node 1510 may be simultaneously read by subsystems on both output 1512 and output 1514 in order to speed reading of integration node 1510.

Max cap unit cell 1500 may replace max cap unit cell 300 in any application of ROIC 100. For example, max cap unit cell 1500 may be used in place of unit cell 202 in FIG. 2, first unit cell 1406 of FIG. 14, and/or second unit cell 1408 of FIG. 14. If max cap unit cell 1500 is used in FPA 1400 of FIG. 14, first output 1512 may connect to first bus 1416, and second output 1514 may connect to second bus 1418.

Figure 16:
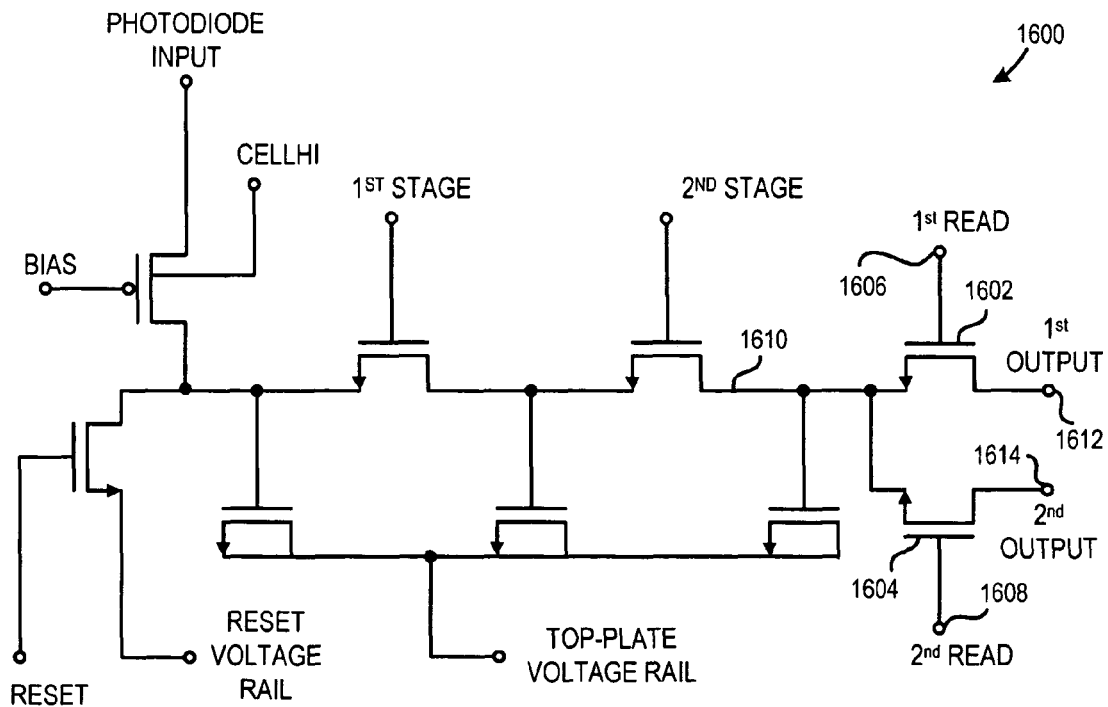
FIG. 16 schematically illustrates a single switch cap unit cell operable to be simultaneously read by two data buses.

FIG. 16 schematically illustrates switch cap unit cell 1600, which is an alternative embodiment of switch cap unit cell 1100. Switch cap unit cell 1600 is identical to switch cap unit cell 1100 with the exception that switch cap unit cell 1600 includes two read switches, first read switch 1602 and second read switch 1604. First read switch 1602 is controlled by first read signal 1606, and second read switch 1604 is controlled by second read signal 1608. First read switch 1602 and second read switch 1604 may operate independently or in unison.

First read switch 1602 connects third stage node 1610 to first output 1612, and second read switch 1604 connects third stage node 1610 to second output 1614. Consequently, third stage node 1610 may be read by a subsystem (e.g. a column buffer) on first output 1612 and/or second output 1614. Third stage node 1610 may be simultaneously read by subsystems on both output 1612 and output 1614 in order to speed reading of first stage node 1610.

Switch cap unit cell 1600 may replace switch cap unit cell 1100 in any application of ROIC 100. For example, switch cap unit cell 1600 may be used in place of unit cell 202 in FIG. 2, first unit cell 1406 of FIG. 14, and/or second unit cell 1408 of FIG. 14. If switch cap unit cell 1600 is used in FPA 1400 of FIG. 14, first output 1612 may connect to first bus 1416, and second output 1614 may connect to second bus 1418.

Figure 17:
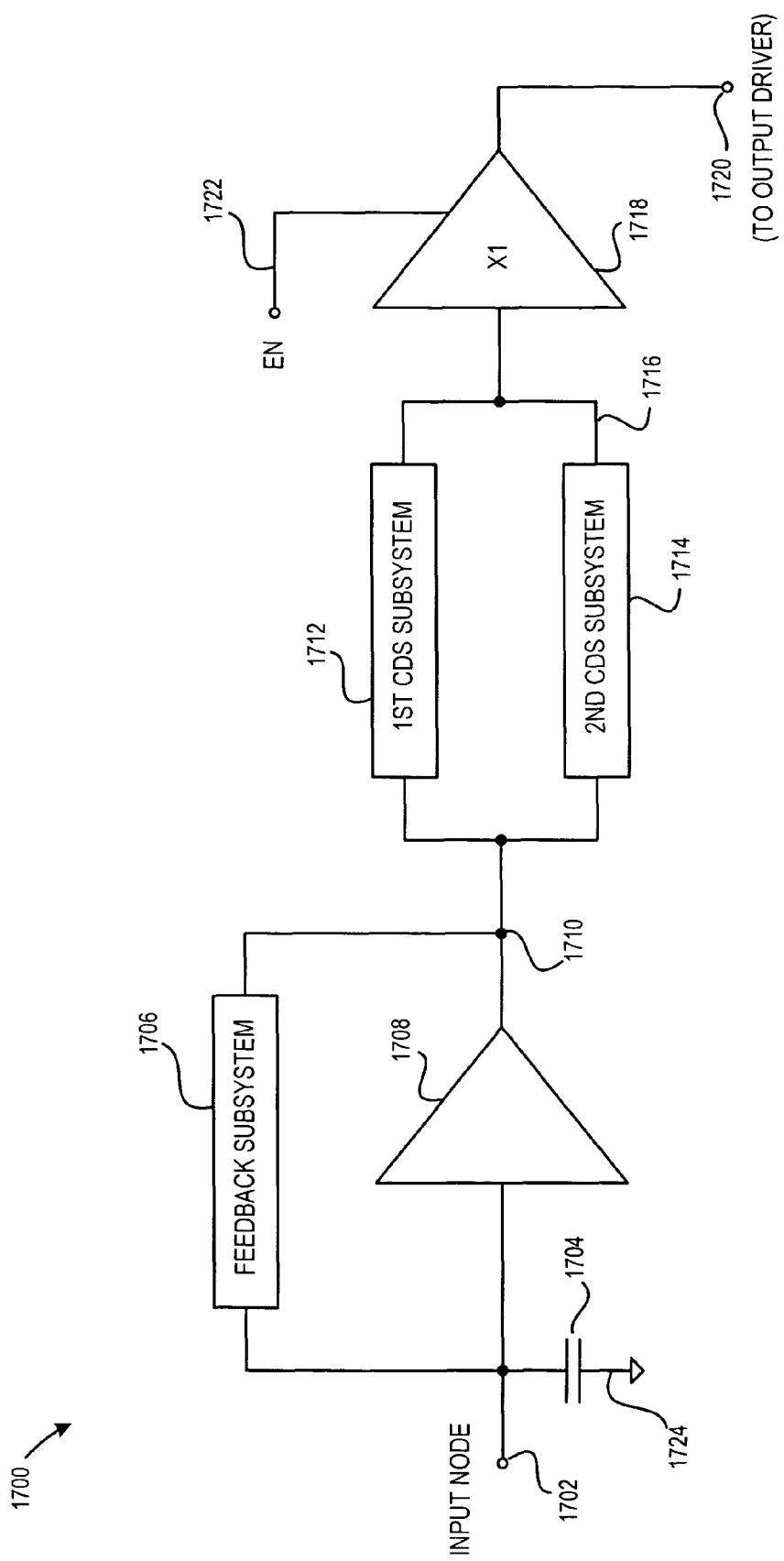
FIG. 17 schematically illustrates a column buffer.

As was stated above, data stored in a unit cell (i.e. an integrated photodiode electric current signal) may be read using a column buffer. FIG. 17 schematically illustrates column buffer 1700, which is an embodiment of a column buffer. Column buffer 1700 may be used as first column buffers 204 of FIG. 2, second column buffers 206 of FIG. 2, first column buffers 1420 of FIG. 14, and/or second column buffers 1432 of FIG. 14. Column buffer 1700 may function to read and amplify a signal from a unit cell.

Column buffer 1700 connects to a unit cell at input node 1702. Column buffer 1700 may connect to any compatible unit cell including max cap unit cell 300, max cap unit cell 1500, switch cap unit cell 1100, and switch cap unit cell 1600. For example, input node 1702 may be connected to output 330 of max cap unit cell 300 or output 1136 of switch cap unit cell 1100.

First buffer subsystem 1708 has an input connected to input node 1702 and an output connected to first buffered node 1710. First buffer subsystem 1708 amplifies a signal present on input node 1702. The gain of first buffer subsystem 1708 is controlled by an equivalent capacitance value of feedback subsystem 1706. The ratio of equivalent capacitance of feedback subsystem 1706 to the combined capacitance of parasitic capacitor 1704 and the integration capacitance of a unit cell connected to input node 1702 determines the noise gain of first buffer subsystem 1708. Thus, in order to optimize the signal to noise ratio of column buffer 1700 for its application, it is desirable that the equivalent capacitance of feedback subsystem 1706 be adjustable.

Feedback subsystem 1706 is connected between input node 1702 and first buffered node 1710. Parasitic capacitor 1704 is connected between input node 1702 and common node 1724. Although common node 1724 is illustrated in FIG. 17 as being at ground potential, common node 1724 may be at another potential.

In an embodiment, an equivalent capacitance of feedback subsystem 1706 may be dynamically configurable. Such equivalent capacitance may be adjusted such that is about equal to an integration capacitance of a unit cell connect to input node 1702 in order to help maximize the dynamic range of column buffer 1700. For example, if output 330 of max cap unit cell 300 is connected to input node 1702, feedback subsystem 1706 may be configured such that it has an equivalent capacitance about equal to the capacitance value of integration capacitor 316 of max cap unit cell 300. Feedback subsystem 1706 is discussed in more detail below with respect to FIGS. 18 and 19.

First correlated double sampling subsystem ("first CDS subsystem") 1712 is connected between first buffered node 1710 and CDS output node 1716. Second correlated double sampling subsystem ("second CDS subsystem") 1714 is connected in parallel with first CDS subsystem 1712. Each CDS subsystems functions to remove switching noise associated with operation of feedback subsystem 1706 as well as store a signal from first buffer subsystem 1708 for later transfer to second buffer subsystem 1718. First CDS subsystem 1712 and second CDS subsystem 1714 operate in a ping-pong manner—during one processing cycle of column buffer 1700, one of the CDS subsystems is obtaining a signal from first buffered node 1710 while the other CDS subsystem is transferring a signal it obtained from first buffered node 1710 during the previous processing cycle to second buffered subsystem 1718. In the next processing cycle, the two CDS subsystems exchange roles. First CDS subsystem 1712 and second CDS subsystem 1714 are discussed in more detail below with respect to FIG. 18.

Second buffer subsystem 1718 has an input connected to CDS output node 1716 and an output connected to column buffer bus node 1720. Column buffer bus node 1720 may be connected to an output driver via a control switching subsystem, such as control switching subsystem 1424 of FIG. 14. Second buffer subsystem 1718 has a gain of one and may be enabled/disabled via enable input 1722.

Figure 18:
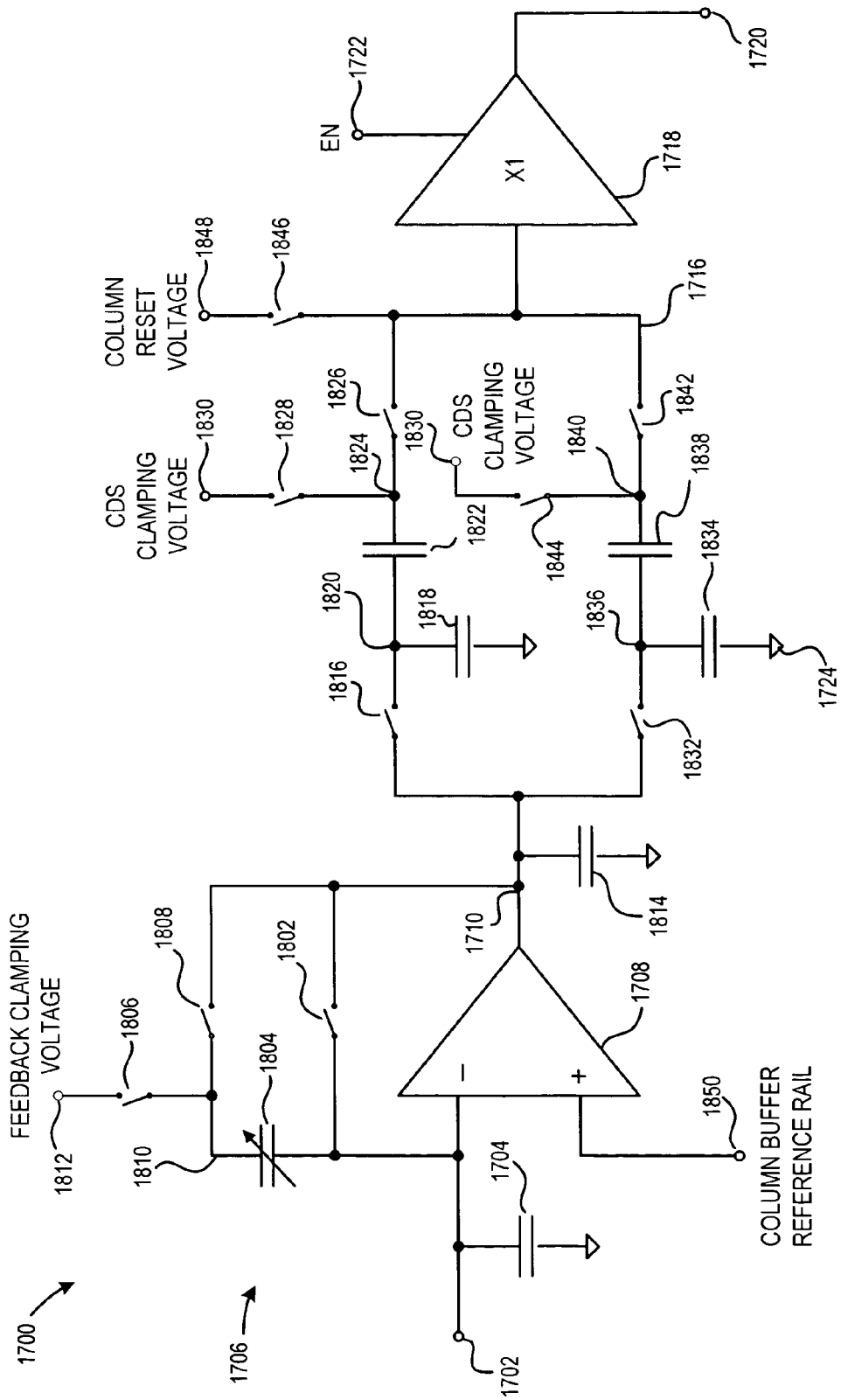
FIG. 18 schematically illustrates the column buffer of FIG. 17 in greater detail.

FIG. 18 schematically illustrates column buffer 1700 in greater detail. As can be seen in FIG. 18, feedback subsystem 1706 includes first feedback switch 1802, variable capacitor 1804, third feedback switch 1808, and second feedback switch 1806.

First feedback switch 1802 is connected between input node 1702 and first buffered node 1710. Variable capacitor 1804 is connected between input node 1702 and internal feedback node 1810; and third feedback switch 1808 is connected between internal feedback node 1810 and first buffered node 1710. Second feedback switch 1806 is connected between internal feedback node 1810 and feedback clamping voltage node 1812. First, second, and third feedback switches 1802, 1806, and 1808 are used to reset feedback subsystem 1706. Operation of feedback subsystem 1706 is discussed in more detail with respect to FIG. 20.

First CDS subsystem 1712 includes first CDS switch 1816, first CDS capacitor 1818, second CDS capacitor 1822, second CDS switch 1826, and third CDS switch 1828. First CDS switch 1816 is connected between first buffered node 1710 and first CDS node 1820; first CDS capacitor 1818 is connected between first CDS node 1820 and common node 1724. Second CDS capacitor 1822 is connected between first CDS node 1820 and second CDS node 1824. Second CDS switch 1826 is connected between second CDS node 1824 and CDS output node 1716; third CDS switch 1828 is connected between second CDS node 1824 and CDS clamping voltage node 1830.

Second CDS subsystem 1714 includes first CDS switch 1832, first CDS capacitor 1834, second CDS capacitor 1838, second CDS switch 1842, and third CDS switch 1844. First CDS switch 1832 is connected between first buffered node 1710 and first CDS node 1836; first CDS capacitor 1834 is connected between first CDS node 1836 and common node 1724. Second CDS capacitor 1838 is connected between first CDS node 1836 and second CDS node 1840. Second CDS switch 1842 is connected between second CDS node 1840 and CDS output node 1716; third CDS switch 1844 is connected between second CDS node 1840 and CDS clamping voltage node 1830.

As was stated above, first CDS subsystem 1712 and second CDS subsystem 1714 operate in a ping-pong fashion. For example, first CDS switches 1816 and 1832 operate in a complementary fashion; similarly second CDS switches 1826 and 1842 operate in complementary fashion. Accordingly, first CDS switch 1816 and second CDS switch 1842 operate in unison; first CDS switch 1832 and second CDS switch 1826 also operate in unison.

Also shown in FIG. 18 are second capacitor 1814, reset switch 1846, and column buffer reference node 1850. Second capacitor 1814 is connected between first buffered node 1710 and common node 1724. Reset switch 1846 is connected between CDS output node 1716 and column reset voltage rail 1848; reset switch 1846 is operable to reset the input of second buffer subsystem 1718. Column buffer reference node 1850 provides a reference to first buffer subsystem 1708.

The switches in FIG. 18 may be implemented in any acceptable manner. For example, the switches may be implemented with N-FETs and/or P-FETs.

Figure 19:
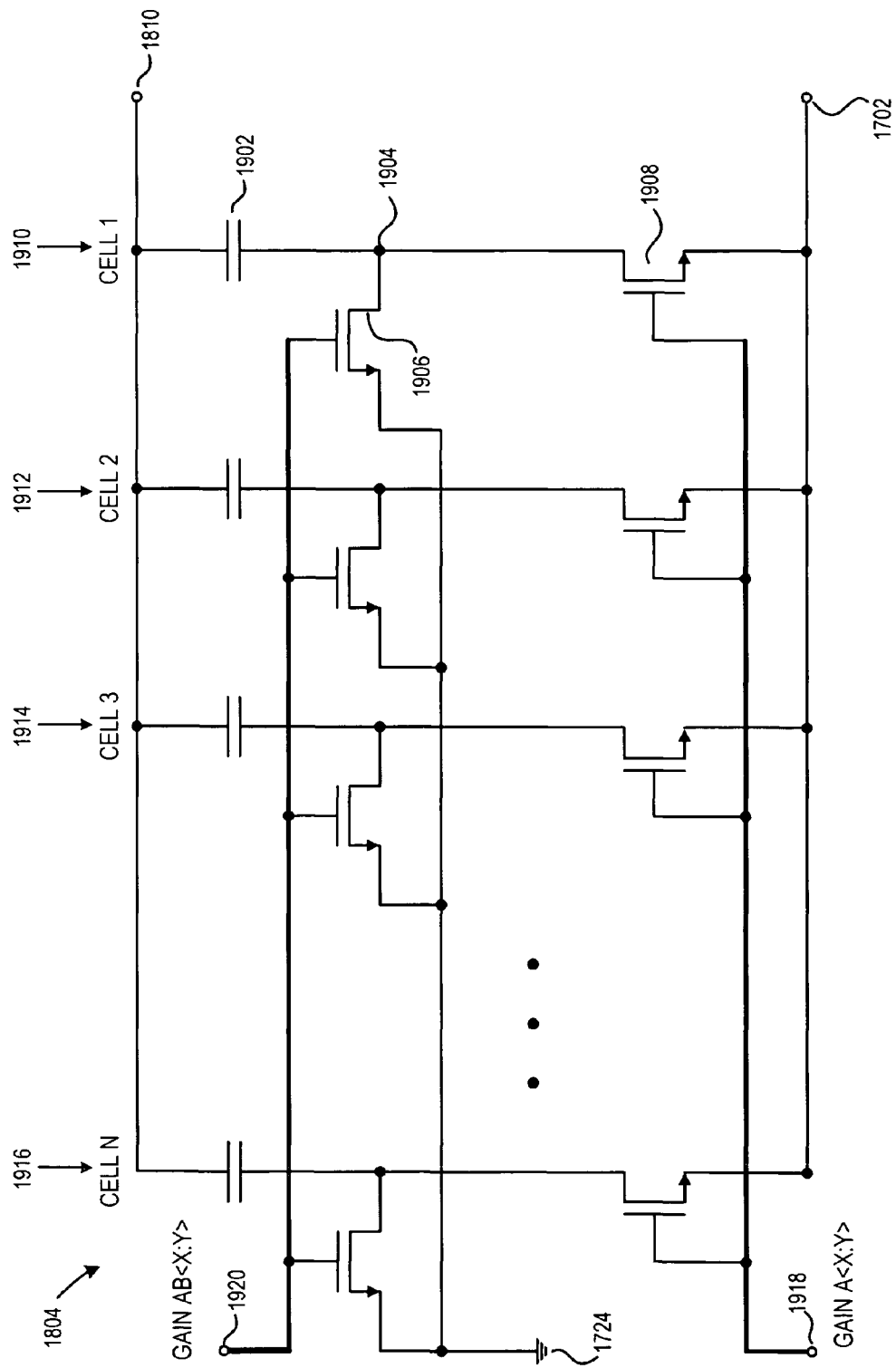
FIG. 19 schematically illustrates a variable capacitor of the column buffer of FIG. 18.

FIG. 19 schematically illustrates variable capacitor 1804, which is connected between internal feedback node 1810 and input node 1702. Variable capacitor 1804 includes at least one capacitance cell, wherein each capacitance cell may be activated or deactivated. The effective capacitance of variable capacitor 1804 may be increased by activating capacitance cells conversely, the effective capacitance of variable capacitor 1804 may be decreased by deactivating capacitance cells. Variable capacitor 1804 is illustrated in FIG. 19 as having capacitance cells 1910, 1912, 1914 and 1916. Capacitance cell 1916 is labeled as capacitance cell "N" to denote that variable capacitor 1804 may have any number of capacitance cells.

Each capacitance cell contains a binary scaled unit capacitor 1902 connected between internal feedback node 1810 and cell center node 1904. Control switch 1908 is connected between cell center node 1904 and input node 1702. Clamping switch 1906 is connected between cell center node 1904 and common node 1724. Control switch 1908 is controlled by a signal on gain control bus 1918, and clamping control switch 1906 is controlled by a signal on inverted gain control bus 1920.

The signals on gain control bus 1918 and inverted gain control bus 1920 are complementary. Consequentially, when control switch 1908 is closed, clamping switch 1906 is open. Conversely, when control switch 1908 is open, clamping switch 1906 is closed. Clamping switch 1906 helps improve the dynamic range of column buffer 1700 by connecting cell center node 1904 to common node 1724 when control switch 1908 is open.

Figure 20:
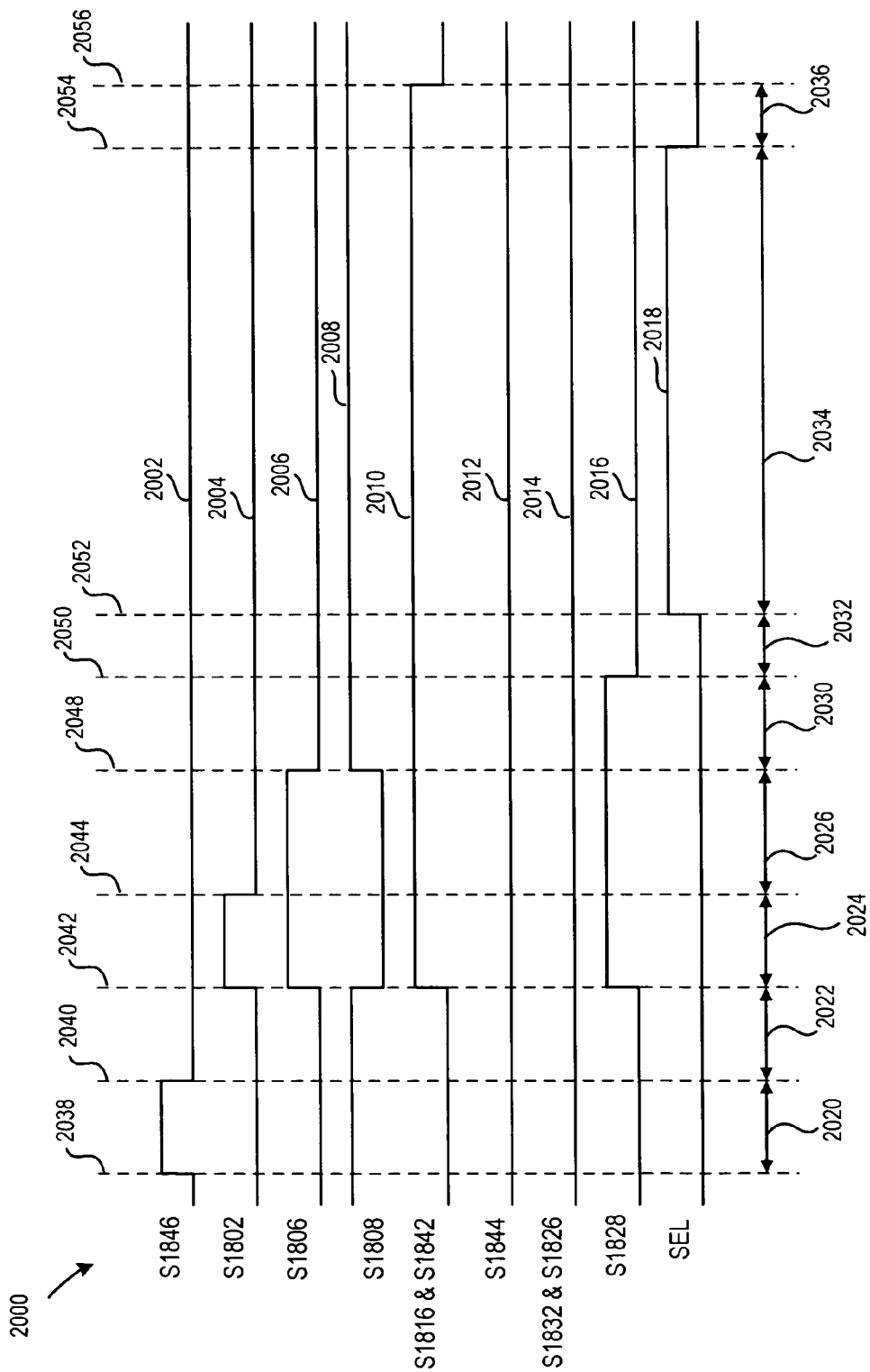
FIG. 20 is a timing diagram illustrating a method of operation of the column buffer of FIG. 18.

FIG. 20 is a timing diagram illustrating method 2000, which is an embodiment of a method of operating column buffer 1700. FIG. 20 illustrates a single processing cycle of method 2000. In FIG. 20, it is assumed that second CDS subsystem 1714 read data from first buffer subsystem 1708 during the previous processing cycle; accordingly, second CDS subsystem 1714 will transfer data to second buffer subsystem 1718 during the current processing cycle. First CDS subsystem 1712 will also obtain data from first buffer subsystem 1708 during the current processing cycle.

FIG. 20 illustrates graphs of the states of various switches of column buffer 1700. A high signal corresponds to the switch being closed; a low signal corresponds to the switch being open. Curve 2002 corresponds to reset switch 1846; curve 2004 corresponds to first feedback switch 1802; curve 2006 corresponds to second feedback switch 1806; curve 2008 corresponds to third feedback switch 1808; curve 2010 corresponds to first CDS switch 1816 and second CDS switch 1842; curve 2012 corresponds to third CDS switch 1844; curve 2014 corresponds to first CDS switch 1832 and second CDS switch 1826; curve 2016 corresponds to third CDS switch 1828, and curve 2018 corresponds to activation of a read switch on a unit cell connected to column buffer 1700. Dashed lines 2038, 2040, 2042, 2044, 2048, 2050, 2052, 2054, and 2056 correspond to instances in time.

Each processing cycle of method 2000 begins with switches in the following states: (1) reset switch 1846, first feedback switch 1802, second feedback switch 1806, first CDS switch 1816, second CDS switch 1842, third CDS switch 1844, first CDS switch 1832, second CDS switch 1826, and third CDS switch 1828 are open, and (2) third feedback switch 1808 is closed. The read switch on the unit cell connected to the column buffer is also initially open.

At time 2038, reset switch 1846 closes for duration 2020. At time 2040, reset switch 1846 opens, and a first delay period of duration 2022 begins. At time 2042, the first delay period ends and a first reset step of duration 2024 begins. First feedback switch 1802, second feedback switch 1806, first CDS switch 1816, second CDS switch 1842, and third CDS switch 1828 all close at time 2042. Third feedback switch 1808 opens at time 2042.

At time 2044, the first reset step ends, and a second reset step of duration 2026 begins. At time 2044, first feedback switch 1802 opens.

At time 2048, the second reset step ends, and third reset step of duration 2030 begins. Second feedback switch 1806 opens and third feedback switch 1808 closes at time 2048.

At time 2050, the third reset step ends, and a second delay period of duration 2032 begins. Third CDS switch 1828 opens at time 2050.

The read switch of the unit cell connected to column buffer 1700 closes at time 2052. The second delay period ends at time 2052 and a read period of duration 2034 begins. A signal from the unit cell is read into first CDS subsystem 1712 during this time.

At time 2054, the read period ends and a third delay period of duration 2036 begins. The read switch on the unit cell opens at time 2054. At time 2056, the third delay period ends, and first CDS switch 1816 and second CDS switch 1842 open. The processing cycle may then be repeated.

As discussed above, it may be desirable to group two unit cells into an integration subsystem. In embodiments of ROIC 100, integration subsystems may be embodied by circuit structures discussed below with respect to FIGS. 21 and 22.

Figure 21:
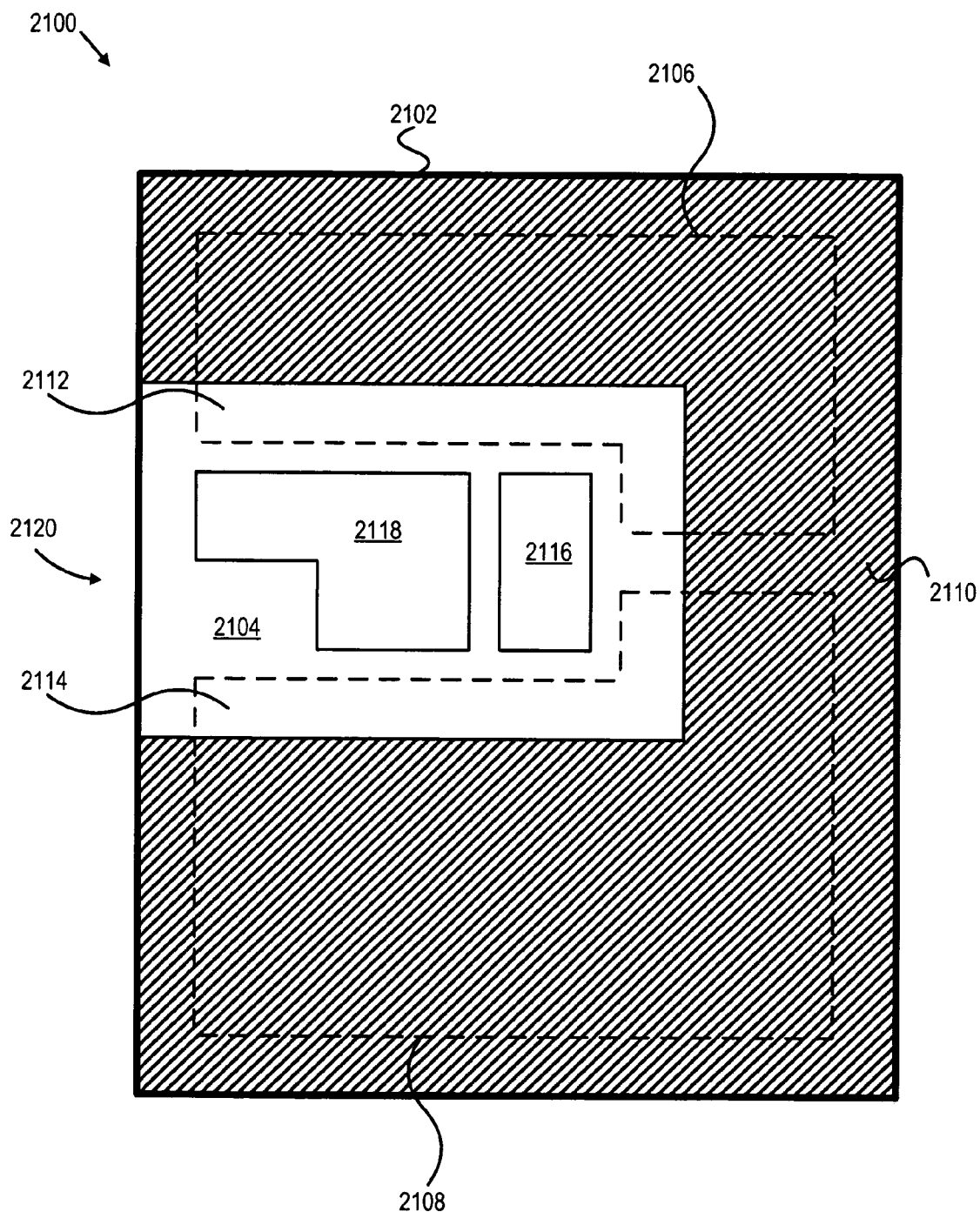
FIG. 21 is a top plan view of a circuit structure including two max cap unit cells.

FIG. 21 is a top plan view of circuit structure 2100 which includes two max cap unit cells that each include two capacitors. For example, circuit structure 2100 may include two instances of max cap unit cell 300 or two instances of max cap unit cell 1100. Integration subsystem 800 may be embodied by circuit structure 2100.

Circuit structure 2100 is illustrated in FIG. 21 as having perimeter 2102 in order to illustrate features of circuit structure 2100; however, a plurality of circuit structures 2100 may be disposed in a common horizontal plane of a larger structure wherein each instance of circuit structure 2100 does not have a delineated perimeter. Such larger structure having a plurality of circuit structures 2100 may be referred to as an array of circuit structures 2100, which may be included in embodiments of ROIC 100.

Circuit structure 2100 is built on p-type substrate 2104, which may be fabricated from doped silicon. As is known in the art, N-FETs may be fabricated by disposing elements including an active layer and a poly silicon layer directly on a p-type substrate. Accordingly, the N-FETs of the two max cap units cells of circuit structure 2100 are fabricated directly on substrate 2104. An array of circuit structures 2100 may share a common substrate 2104.

Circuit structure 2100 includes two N-FETs configured to function as capacitors. The first NFET or capacitor ("first capacitor") is fabricated from elements including (1) active layer section 2106, which is denoted by dashed lines and disposed above substrate 2104, and (2) poly silicon layer 2110, which is denoted by shading with hatched lines and is disposed above active layer section 2106. The second NFET or capacitor ("second capacitor") is fabricated from elements including (1) active layer section 2108, which is denoted by dashed lines and disposed above substrate 2104, and (2) and poly silicon layer 2110, which is disposed above active layer section 2108. Active layer sections 2106 and 2108 lie in a common horizontal plane disposed between substrate 2104 and poly silicon layer 2110. Both the first and second capacitor share poly silicon layer 2110; this may advantageously increase each capacitor's charge capacity because each capacitor has a poly silicon layer with a larger effective surface area than it would have if poly silicon layer 2110 were divided into dedicated sections for each capacitor. Charge capacity is proportional to poly silicon layer surface area; consequentially a capacitor's charge capacity will increase if the surface area of its poly silicon layer is increased. As an example, if circuit structure 2100 is an embodiment of integration subsystem 800, integration capacitor 822 may be embodied by the first capacitor, and integration capacitor 844 may be embodied by the second capacitor.

The remaining N-FETs of circuit structure 2100, such as N-FETs that act as switches, are located in N-FET subsection 2116, which is located between the first and second capacitors. Each N-FET of N-FET subsection 2116 includes an active layer section disposed above substrate 2104 and a poly silicon layer section disposed above the active layer section. Individual N-FETs of N-FET subsection 2116 are not illustrated in FIG. 21 in order to not obscure the essential features of FIG. 21.

As stated above, a N-FET can be directly fabricated on a p-type substrate. However, a P-FET generally must be fabricated on a n-type substrate. In order to fabricate a P-FET on a p-type substrate, the P-FET must be fabricated on a section of the p-type substrate that has been delineated and doped such that it has n-type properties. Such delineated section is commonly referred to as a "Nwell". It should be noted that a Nwell generally can house only P-FETs that are operated from a common voltage potential. It should also be noted that a Nwell generally has a spacing requirement that prevents other elements from being located within a certain distance of the Nwell.

Circuit structure 2100 includes Nwell 2118, in which substrate 2104 has been doped to have n-type properties. Nwell 2118 is able to include all P-FETs of circuit structure 2100 if they are all operable from a common voltage potential. For example, if circuit structure 2100 is an embodiment of integration subsystem 800, Nwell 2118 would be able to include all P-FETs (e.g. bias subsystems 816 and 838, cell link switch 810) because they all operate from a common supply voltage rail. It may be advantageous to include all P-FETs of circuit structure 2100 in a single Nwell to prevent substrate 2104 surface area from needing to be devoted to a plurality of Nwells and their spacing requirements.

It should be noted that active layer sections 2106 and 2108 extend horizontally beyond the outline of poly silicon layer 2110 solely within transistor subsection area 2120. Stated in another manner, solely the sides of active layer sections 2106 and 2108 that are adjacent to N-FETs 2116 and Nwell 2118 extend horizontally beyond poly silicon layer 2110. The subsection of active layer 2106 that extends beyond the outline poly silicon layer 2110 is denoted as subsection 2112; the subsection of active layer 2108 that extends beyond poly silicon layer 2110 is denoted as subsection 2114. Subsections 2112 and 2114 may be used to interface one or more N-FETs of N-FET subsection 2116 and/or one or more P-FETs of Nwell to 2118 to active layer section 2106 and active layer section 2108, respectively.

Each instance of circuit structure 2100 may be disposed in an array of circuit structures 2100 such that their perimeters 2102 adjoin. Such configuration is possible because the active layer sections of circuit structure 2100 do not extend beyond perimeter 2102; consequentially, the active layer sections will not touch each other if a plurality of circuit structures 2100 are disposed such that their perimeters 2102 adjoin.

Conversely, it should be noted that poly silicon layer 2110 touches perimeter 2102. Consequently, if a plurality of circuit structures 2100 are disposed in an array such that their perimeters 2102 adjoin, their respective poly silicon layers 2110 will touch. This will result in each first capacitor and each second capacitor having a poly silicon layer with an effective surface area equal to the sum of the surface areas of the poly silicon layers of each circuit structure 2100. Such property may advantageously increase each capacitor's charge capacity because as stated above, charge capacity is proportional to poly silicon layer surface area.

An embodiment of circuit structure 2100, which is designed using 0.25 micron design rules, houses all P-FETs in Nwell 2118. This embodiment has a 20 micron footprint.

Figure 22:
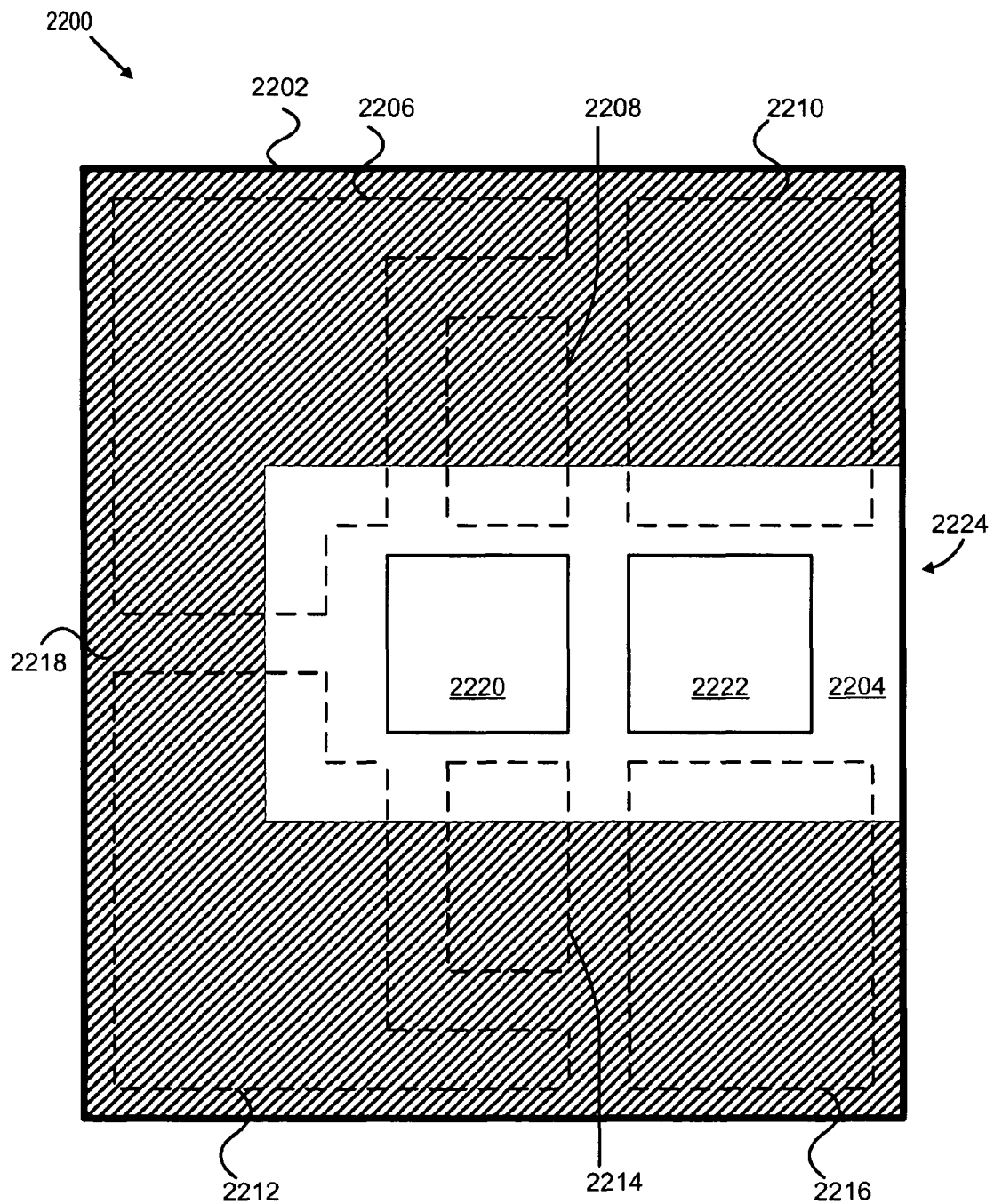
FIG. 22 is a top plan view of a circuit structure including two switch cap unit cells.

FIG. 22 is a top plan view of circuit structure 2200, which may be used to implement two instances of switch cap unit cells that each include three capacitors. For example, circuit structure 2200 may be used to implement two instances of switch cap unit cell 1100 or switch cap unit cell 1600. Circuit structure 2200 is similar to circuit structure 2100, however circuit structure 2200 includes six capacitors while circuit structure 2100 includes two capacitors.

Circuit structure 2100 is illustrated in FIG. 22 as having perimeter 2202 in order to illustrate features of circuit structure 2200; however, a plurality of circuit structures 2200 may be disposed in a common horizontal plane of a larger structure wherein each instance of circuit structure 2200 does not have a delineated perimeter. Such larger structure having a plurality of circuit structures 2200 is referred to as an array of circuit structures 2200, which may be included in embodiments of ROIC 100.

Circuit structure 2200 is built on p-type substrate 2204, which may be fabricated from doped silicon. As is known in the art, N-FETs may be fabricated by disposing elements including an active layer and a poly silicon layer directly on a p-type substrate. Accordingly, the N-FETs of the two max cap units cells of circuit structure 2200 are fabricated directly on substrate 2204. An array of circuit structures 2200 may share a common substrate 2204.

Circuit structure 2200 includes six N-FETs configured to function as capacitors. The first NFET or capacitor ("first capacitor") is fabricated from elements including (1) active layer section 2206, which is denoted by dashed lines and disposed above substrate 2204, and (2) poly silicon layer 2218, which is denoted by shading with hatched lines and is disposed above active layer section 2206. The second NFET or capacitor ("second capacitor") is fabricated from elements including (1) active layer section 2208, which is denoted by dashed lines and disposed above substrate 2204, and (2) and poly silicon layer 2218, which is disposed above active layer section 2208. The third NFET or capacitor ("third capacitor") is fabricated from elements including (1) active layer section 2210, which is denoted by dashed lines and disposed above substrate 2204, and (2) and poly silicon layer 2218, which is disposed above active layer section 2210. The fourth NFET or capacitor ("fourth capacitor") is fabricated from elements including (1) active layer section 2212, which is denoted by dashed lines and disposed above substrate 2204, and (2) and poly silicon layer 2218, which is disposed above active layer section 2212. The fifth NFET or capacitor ("fifth capacitor") is fabricated from elements including (1) active layer section 2214, which is denoted by dashed lines and disposed above substrate 2204, and (2) and poly silicon layer 2218, which is disposed above active layer section 2214. The sixth NFET or capacitor ("sixth capacitor") is fabricated from elements including (1) active layer section 2216, which is denoted by dashed lines and disposed above substrate 2204, and (2) and poly silicon layer 2218, which is disposed above active layer section 2216.

Active layer sections 2206, 2208, 2210, 2212, 2214, and 2216 lie in a common horizontal plane disposed between substrate 2204 and poly silicon layer 2218. All capacitors share poly silicon layer 2218; this may advantageously increase each capacitor's charge capacity because each capacitor has a poly silicon layer with a larger effective surface area than it would have if poly silicon layer 2218 were divided into a dedicated section for each capacitor. As an example, consider circuit structure 2200 embodying an integration subsystem including two unit cells 1100. First capacitor 1122, second capacitor 1124, and third capacitor 1126 of the first unit cell may be realized by the first capacitor, the second capacitor, and the third capacitor of circuit structure 2200. Similarly, first capacitor 1122, second capacitor 1124, and third capacitor 1126 of the second unit cell may be realized by the fourth capacitor, the fifth capacitor, and the sixth capacitor of circuit structure 2200.

The remaining N-FETs of circuit structure 2200, such as N-FETs that act as switches, are located in N-FET subsection 2220, which is located between the capacitors. Each N-FET of N-FET subsection 2220 includes an active layer section disposed above substrate 2204 and a poly silicon layer section disposed above the active layer section. Individual N-FETs of N-FET subsection 2220 are not illustrated in FIG. 22 in order to not obscure the essential feature of FIG. 22.

Circuit structure 2200 includes Nwell 2222, in which substrate 2204 has been doped to have n-type properties. Nwell 2222 is able to include all P-FETs of circuit structure 2200 if they are all operable from a common voltage potential. For example, if circuit structure 2200 is an embodiment of two unit cells 1100, Nwell 2222 would be able to include all P-FETs (e.g. two instances of bias subsystem 1102) because they all operate from a common supply voltage rail. It may be advantageous to include all P-FETs of circuit structure 2200 in a single Nwell to prevent substrate 2204 surface area from needing to be devoted to a plurality of Nwells and their spacing requirements.

It should be noted that active layer sections 2206, 2208; 2210, 2212, 2214, and 2216 extend horizontally beyond the outline of poly silicon layer 2218 solely within transistor subsection area 2224. Stated in another manner, solely the sides of active layer sections 2206, 2208, 2210, 2212, 2214, and 2216 that are adjacent to N-FET subsection 2220 and Nwell 2222 extend horizontally beyond the outline of poly silicon layer 2218. The subsections of the active layers that extend beyond poly silicon layer 2218 may be used to interface one or more N-FETs of N-FET subsection 2220 and/or one or more P-FETs of Nwell to 2222 to one or more of the active layer sections.

Each instance of circuit structure 2100 may be disposed in an array of circuit structures 2200 such that their perimeters 2202 adjoin. Such configuration is possible because the active layer sections of circuit structure 2200 do not extend beyond perimeter 2202; consequentially, the active layer sections will not touch if a plurality of circuit structures 2200 are disposed such that their perimeters 2202 adjoin.

Conversely, it should be noted that poly silicon layer 2218 touches perimeter 2202. Consequently, if a plurality of circuit structures 2200 are disposed in an array such that their perimeters 2202 adjoin, their respective poly silicon layers 2218 will touch. This will result in each capacitor having a poly silicon layer with an effective surface area equal to the sum of the surface areas of the poly silicon layers of each circuit structure 2200. Such property may advantageously increase each capacitor's charge capacity because as stated above, charge capacity is proportional to poly silicon layer surface area.

An embodiment of circuit structure 2200, which is designed using 0.25 micron design rules, houses all P-FETs in Nwell 2222. This embodiment has a 20 micron footprint.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A read out integrated circuit (ROIC), comprising a plurality of unit cells, each unit cell including:
   a bias subsystem connected between a photodiode input and a reset node;
   a reset switch connected between the reset node and a reset voltage rail;
   an isolation switch connected between the reset node and an integration node;
   an integration capacitor connected between the integration node and a top-plate voltage rail; and
   a read switch connected between the integration node and an output.

2. A method of operating at least one unit cell of the ROIC of claim 1 in a snap-shot mode, comprising the steps of:
   operating the bias subsystem such that it provides a predetermined bias voltage;
   executing the following steps one or more times:
     waiting an integration mode time duration wherein the isolation switch is closed and the reset and read switches are open;
     opening the isolation switch at an end of the integration mode time duration;
     waiting a read delay mode time duration;
     closing the reset switch during the read delay mode time duration;
     waiting a read mode time duration;
     closing the read switch for a predetermined amount of time during the read mode time duration;
     closing the isolation switch at an end of the read mode time duration;
     waiting a reset mode time duration; and
     opening the reset switch at an end of the reset mode time duration.

3. The method of claim 2 further comprising operating at least one unit cell in a power down mode or a standby mode while operating at least one unit cell in the snap-shot mode.

4. A method of operating at least one unit cell of the ROIC of claim 1 in a ripple read mode, comprising the steps of:
   operating the bias subsystem such that it provides a predetermined bias voltage;
   executing the following steps one or more times:
     waiting an integration mode time duration wherein the isolation switch is closed and the reset and read switches are open;
     closing the read switch at an end of the integration mode time duration;
     waiting a read mode time duration;
     opening the read switch and closing the reset switch at an end of the read mode time duration;
     waiting a reset mode time duration; and
     opening the reset switch at an end of the reset mode time duration.

5. The method of claim 4, further comprising operating at least one unit cell in a power down mode or a standby mode while operating at least one unit cell in the ripple read mode.

6. A method of operating at least one unit cell of the ROIC of claim 1 in a standby mode, comprising the steps of:
   operating the bias subsystem such that it provides a predetermined bias voltage;
   closing the reset switch if it is not already closed; and
   opening the isolation switch if it is not already open.

7. A method of operating at least one unit cell of the ROIC of claim 1, including the steps of:
   setting a magnitude of the top-plate voltage rail greater than a magnitude of a supply voltage rail for the ROIC; and
   setting a high state voltage magnitude of a control signal for the read switch greater than the magnitude of the supply voltage rail for the ROIC.

8. The ROIC of claim 1, wherein the plurality of units cells are grouped into one or more integration subsystems, each integration subsystem including:
   a first unit cell including:
     a first bias subsystem connected between a first photodiode input and a first reset node;
     a first reset switch connected between the first reset node and a first reset voltage rail;
     a first isolation switch connected between the first reset node and a first integration node;
     a first integration capacitor connected between the first integration node and a top-plate voltage rail; and
     a first read switch connected between the first integration node and a first output;
   a second unit cell including:
     a second bias subsystem connected between a second photodiode input and a second reset node;
     a second reset switch connected between the second reset node and a second reset voltage rail;
     a second isolation switch connected between the second reset node and a second integration node;
     a second integration capacitor connected between the second integration node and the top-plate voltage rail; and
     a second read switch connected between the second integration node and a second output; and
     a connection subsystem operable to connect the first integration node to the second integration node.

9. A method of operating the ROTC of claim 8, comprising the steps of:

configuring the connection subsystem of each integration subsystem such that the first integration node is coupled to the second integration node;
operating the second unit cell in each integration subsystem in a standby mode,
including the following steps:
operating the second bias subsystem such that it provides a predetermined bias voltage;
closing the second reset switch if it is not already closed; and
opening the second isolation switch and the second read switch if they are not already open; and
operating the first unit cell in each integration subsystem in a snap-shot mode,
including the following steps:
operating the first bias subsystem such that it provides a predetermined bias voltage; and
executing the following steps one or more times:
waiting an integration mode time duration wherein the first isolation switch is closed and the first reset and first read switches are open;
opening the first isolation switch at an end of the integration mode time duration;
waiting a read delay mode time duration;
closing the first reset switch during the read delay mode time duration; waiting a read mode time duration;
closing the first read switch for a predetermined amount of time during the read mode time duration;
closing the first isolation switch at an end of the read mode time duration; waiting a reset mode time duration; and
opening the first reset switch at an end of the reset mode time duration.

10. A method of operating the ROTC of claim 8, comprising the steps of:
configuring the connection subsystem of each integration subsystem such that the first integration node is coupled to the second integration node;
operating the second unit cell in each integration subsystem in a standby mode, including the following steps:
operating the second bias subsystem such that it provides a predetermined bias voltage;
closing the second reset switch if it is not already closed; and
opening the second isolation switch and the second read switch if they are not already open; and
operating the first unit cell in each integration subsystem in a ripple read mode, including the following steps:
operating the first bias subsystem such that it provides a predetermined bias voltage; and
executing the following steps one or more times:
waiting an integration mode time duration, wherein the first reset switch and the first read switch are open and the first isolation switch is closed;
closing the first read switch at an end of the integration mode time duration;
waiting a read mode time duration;
opening the first read switch and closing the first reset switch at an end of the read mode time duration;
waiting a reset mode time duration; and
opening the first reset switch at an end of the reset mode time duration.

11. The ROTC of claim 1, further comprising an additional read switch connected between the integration node and an additional output.

12. A read out integrated circuit (ROTC), comprising a plurality of unit cells, each unit cell including:
a bias subsystem connected between a photodiode input and a first stage node;
a reset switch connected between the first stage node and a reset voltage rail;
a first capacitor connected between the first stage node and a top-plate voltage rail;
a first stage switch connected between the first stage node and a second stage node;
a second capacitor connected between the second stage node and the top-plate voltage rail;
a second stage switch connected between the second stage node and a third stage node;
a third capacitor connected between the third stage node and the top-plate voltage rail; and
a read switch connected between the third stage node and an output.

13. A method of operating at least one unit cell of the ROIC of claim 12 in a snap-shot, averaging mode, comprising the steps of:
operating the bias subsystem such that it provides a predetermined bias voltage;
executing the following steps one or more times:
waiting an initial integration mode time duration, wherein the read switch and the second stage switch are open, the first stage switch is closed, and the reset switch is initially closed;
opening the reset switch during the initial integration mode time duration;
opening the first stage switch at an end of the initial integration mode time duration;
waiting an initial reset mode time duration;
closing the reset switch and the second stage switch at about a same time during the initial reset mode time duration;
executing the following steps one or more times:
opening the second stage switch;
waiting an integration mode time duration;
closing the first stage switch during the integration mode time duration;
opening the reset switch subsequent to closing the first stage switch during the integration mode time duration;
opening the first stage switch at an end of the integration mode time duration;
waiting a reset mode time duration; and
closing the reset switch and the second stage switch at about a same time during the reset mode time duration;
waiting a read delay mode time duration;
closing the read switch at an end of the read delay mode time duration;
waiting a read mode time duration;
opening the read switch and closing the first stage switch at an end of the read mode time duration;
waiting a post read mode time duration; and
opening the second stage switch at an end of the post read mode time duration.

14. The method of claim 13, further comprising operating at least one unit cell in a power down mode while operating at least one unit cell in the snap-shot; averaging mode.

15. A method of operating at least one unit cell of the ROIC of claim 12 in a snap-shot, direct integration mode, comprising the steps of:
operating the bias subsystem such that it provides a predetermined bias voltage;
closing the second stage switch if it is not already closed;
executing the following steps one or more times:

waiting an integration mode time duration wherein the first stage switch is closed and the reset switch and the read switch are open;
opening the first stage switch at an end of the integration mode time duration;
waiting a read delay mode time duration;
closing the reset switch during the read delay mode time duration;
waiting a read mode time duration;
closing the read switch for a predetermined amount of time during the read mode time duration;
closing the first stage switch at an end of the read mode time duration;
waiting a reset mode time duration; and
opening the reset switch at an end of the reset mode time duration.

16. The method of claim 15, further comprising operating at least one unit cell in a power down mode while operating at least one unit cell in the snap-shot, direct integration mode.

17. A method of operating at least one unit cell of the ROIC of claim 12, including the steps of:
operating the unit cell in a snap-shot, averaging mode if a flux density of light received by a photodiode connected to the photodiode input is above a predetermined threshold; and
operating the unit cell in a snap-shot, direct integration mode if the flux density of light received by the photodiode connected to the photodiode input is below the predetermined threshold.

18. A method of operating at least one unit cell of the ROIC of claim 12 in a standby mode, comprising the steps of
operating the bias subsystem such that it provides a predetermined bias voltage;
closing the reset switch if it is not already closed; and
opening the first stage switch if it is not already open.

19. The ROIC of claim 12, wherein the plurality of units cells are grouped into one or more integration subsystems, each integration subsystem including:
a first unit cell; and
a second unit cell.

20. A method of operating at least one unit cell of the ROIC of claim 12, including the step of:
setting a voltage magnitude of the top-plate voltage rail greater than a voltage magnitude of a supply voltage rail for the ROIC; and
setting high state voltage magnitudes of control signals for the first stage switch, the second stage switch, and the read switch greater than the voltage magnitude of the supply voltage rail for the ROIC.

21. The ROIC of claim 12, further comprising a second read switch connected between the third stage node and a second output.

22. A focal plane array (FPA), comprising:
a plurality of photo detectors disposed in a grid, the grid having a plurality of horizontal rows of photo detectors and a plurality of vertical columns of photo detectors, each photo detector having a first color photodiode and a second color photodiode; and
a read out integrated circuit (ROIC) including:
an integration subsystem coupled to each photo detector, each integration subsystem including:
a first unit cell having a photodiode input coupled to the first color photodiode of a respective photo detector; and
a second unit cell having a photodiode input coupled to the second color photodiode of the respective photo detector;
a first column buffer and a second column buffer for each column of photo detectors;
a first bus for each column of photo detectors, the first bus connecting an output of each first unit cell of the column to an input of the first column buffer of the column;
a second bus for each column of photo detectors, the second bus connecting an output of each second unit cell of the column to an input of the second column buffer of the column;
a control switching subsystem connected to an output of each column buffer; and
at least one output driver connected to the control switching subsystem.

23. The FPA of claim 22, wherein each first unit cell and each second unit cell further comprise:
a bias subsystem connected between the photodiode input and a reset node;
a reset switch connected between the reset node and a reset voltage rail;
an isolation switch connected between the reset node and an integration node;
an integration capacitor connected between the integration node and a top-plate voltage rail; and
a read switch connected between the integration node and an output.

24. A method of operating the FPA of claim 23, comprising the step of independently controlling a frame rate of one or more first unit cells independently of a frame rate of one or more second unit cells.

25. A method of operating the FPA of claim 23, comprising the steps of:
configuring each horizontal row of pixels such that a first quantity of first pixels are active and a first quantity of second pixels are active; and
configuring each vertical column of pixels such that a second quantity of first pixels are active and a second quantity of second pixels are active.

26. A method of operating the FPA of claim 23, comprising the step of operating each first unit cell in a snap-shot mode and operating each second unit cell in a ripple read mode.

27. A method of operating the FPA of claim 23, comprising the step of configuring the FPA such that solely every second pixel of every second row of pixels is active.

28. A method of operating the FPA of claim 23, comprising the step of configuring the FPA such that solely every fourth pixel of every fourth row of pixels is active.

29. The FPA of claim 22, further comprising a connection subsystem in each integration subsystem, the connection subsystem operable to connect an integration node of the first unit cell to an integration node of the second unit cell.

30. A method of operating the FPA of claim 22, comprising the steps of:
reading an odd row of first unit cells via the first or second bus while reading an adjacent even row of first unit cells via a bus not used for reading the odd row of first unit cells; and
reading an odd row of second unit cells via the first or second bus while reading an adjacent even row of second unit cells via a bus not used for reading the odd row of second unit cells, the second unit cells being read at a different time than the first unit cells.

31. A method of operating the FPA of claim 22, comprising the steps of:
reading a first set of pixels having a first integration mode time duration at an end of the first integration mode time duration; and reading a second set of pixels having a second integration mode time duration at an end of the second integration mode time duration, the second integration mode time duration being greater than the first integration mode time duration.

32. The FPA of claim 22, wherein each first unit cell and each second unit cell further comprise:
   a bias subsystem connected between the photodiode input and a first stage node;
   a reset switch connected between the first stage node and a reset voltage rail;
   a first capacitor connected between the first stage node and a top-plate rail;
   a first stage switch connected between the first stage node and a second stage node;
   a second capacitor connected between the second stage node and the top-plate rail;
   a second stage switch connected between the second stage node and a third stage node;
   a third capacitor connected between the third stage node and the top-plate rail; and
   a read switch connected between the third stage node and an output.

33. The FPA of claim 22, wherein:
   the first unit cell further comprises:
      a bias subsystem connected between the photodiode input and a first stage node;
      a reset switch connected between the first stage node and a reset voltage rail;
      a first capacitor connected between the first stage node and a top-plate voltage rail;
      a first stage switch connected between the first stage node and a second stage node;
      a second capacitor connected between the second stage node and the top-plate voltage rail;
      a second stage switch connected between the second stage node and a third stage node;
      a third capacitor connected between the third stage node and the top-plate voltage rail; and
      a read switch connected between the third stage node and an output; and
   the second unit cell further comprises:
      a bias subsystem connected between the photodiode input and a reset node;
      a reset switch connected between the reset node and a reset voltage rail;
      an isolation switch connected between the reset node and an integration node an integration capacitor connected between the integration node and a top-plate voltage rail; and
      a read switch connected between the integration node and an output.

34. The FPA of claim 33, wherein:
   each first color photodiode is optimized to capture long wave infrared light; and
   each second color photodiode is optimized to capture medium wave infrared light.

35. A method of operating the FPA of claim 33, comprising the steps of:
   operating each first unit cell in a snap-shot, averaging mode if a flux density of light received by the first color photodiodes is above a predetermined threshold; and
   operating each first unit cell in a snap-shot, direct integration mode if the flux density of light received by the first color photodiodes is below the predetermined threshold.

36. A method of operating the FPA of claim 22, comprising the step of controlling operation of each first unit cell independently of operation of each second unit cell.

37. The FPA of claim 22 further comprising:
   at least one horizontal scanner;
   at least one vertical scanner;
   at least one bias generator; and
   at least one control subsystem.

38. A column buffer, comprising:
   a first buffer subsystem having an input connected to an input node and an output connected to a first buffered node;
   a feedback subsystem connected between the input node and the first buffered node;
   a first correlated double sampling (CDS) subsystem connected between the first buffered node and a CDS output node;
   a second CDS subsystem connected between the first buffered node the CDS output node; and
   a second buffer subsystem including:
      an input connected to the CDS output node;
      an output connected to a column buffer bus node; and
      an enable input operable to control an operating state of the second buffer subsystem.

39. A method of operating the column buffer of claim 38, comprising configuring the feedback subsystem such that it has a capacitance value about equal to an integration capacitance of a unit cell connected to the input node.

40. A method of operating the column buffer of claim 38, comprising operating the first and second CDS subsystems in manner such one of the CDS subsystems is a reading a signal from the first buffered node while the other CDS subsystem is transferring a previously read signal to the CDS output node.

41. The column buffer of claim 38, wherein:
   the feedback subsystem includes:
      a first feedback switch connected between the input node and the first buffered node;
      a variable capacitor connected between the input node and an internal feedback node;
      a third feedback third switch connected between the internal feedback node and the first buffered node; and
      a second feedback switch connected between the internal feedback node and a feedback clamping voltage rail;
   the first CDS subsystem and the second CDS subsystem each include:
      a first CDS switch connected between the first buffered node and a first CDS node;
      a first CDS capacitor connected between the first CDS node and a common node;
      a second CDS capacitor connected between the first CDS node and a second CDS node;
      a second CDS switch connected between the second CDS node and the CDS output node; and
      a third CDS switch connected between the second CDS node and a CDS clamping voltage rail; and
   a reset switch connected between the CDS output node and a column reset voltage rail.

42. The column buffer of claim 41, wherein the variable capacitor further comprises at least one capacitance cell; each capacitance cell including:
   a unit capacitor connected between the internal feedback node and a cell center node;
   a control switch connected between the cell center node and the input node; and a clamping switch connected between the cell center node and the common node.

43. A method of operating the column buffer of claim 42, comprising the step of operating the control switch and the clamping switch in a complementary fashion.

44. A read out integrated circuit (ROIC), comprising at least one integration subsystem, each integration subsystem including:
- a transistor subsection including:
  - a nwell including:
    - a p-channel depletion metal oxide field effect transistor of a biasing subsystem of a first unit cell; and
    - a p-channel depletion metal oxide field effect transistor of a biasing subsystem of a second unit cell; and
  - an n-channel depletion metal oxide field effect transistor subsection;
- a horizontal poly silicon layer adjacent to three sides of the transistor subsection; and
- a plurality of horizontal active layer sections disposed below the poly silicon layer, wherein each active layer section extends horizontally beyond an outline of the poly silicon layer solely along sides of the active layer section adjacent to the transistor subsection.

45. The ROTC of claim 44, wherein the nwell further comprises a p-channel depletion metal oxide field effect transistor of a connection subsystem.

46. The ROTC of claim 44 further comprising two active layer sections.

47. The ROTC of claim 44 further comprising six active layer sections.

48. The ROTC of claim 44 further comprising a plurality of integration subsystems disposed in a common horizontal plane, the poly silicon layers of each integration subsystem mechanically and electrically coupled together.

* * * * *